(12) United States Patent
Kosaka et al.

(10) Patent No.: US 6,297,902 B1
(45) Date of Patent: Oct. 2, 2001

(54) LIGHT AMPLIFICATION MEDIUM CONTROL METHOD, LIGHT AMPLIFICATION APPARATUS AND SYSTEM USING THE SAME

(75) Inventors: Junya Kosaka, Fujisawa; Shinji Sakano, Yokohama; Yoshiaki Sato, Chiba; Kazuo Aida, Yokohama, all of (JP)

(73) Assignees: Hitachi, Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 08/793,151
(22) PCT Filed: Jul. 4, 1996
(86) PCT No.: PCT/JP96/01853
  § 371 Date: Feb. 18, 1997
  § 102(e) Date: Feb. 18, 1997
(87) PCT Pub. No.: WO97/02633
  PCT Pub. Date: Jan. 23, 1997

(30) Foreign Application Priority Data

Jul. 5, 1995 (JP) .................................................. 7-169831

(51) Int. Cl.[7] .............................. G02F 1/35; H04B 10/04; H01J 13/00
(52) U.S. Cl. ........................ 359/337; 359/134; 359/177; 359/194; 359/341
(58) Field of Search .................................... 359/134, 160, 359/161, 177, 194, 337, 341

(56) References Cited

U.S. PATENT DOCUMENTS

| | | | |
|---|---|---|---|
| 5,239,607 | * | 8/1993 | da Silva et al. .................... 385/122 |
| 5,506,724 | * | 4/1996 | Shimizu et al. ..................... 359/341 |
| 5,537,244 | * | 7/1996 | Fukushima et al. ................. 359/341 |
| 5,680,246 | * | 10/1997 | Takahashi et al. .................. 359/341 |

FOREIGN PATENT DOCUMENTS

| | | | |
|---|---|---|---|
| 0477021 | | 3/1992 | (EP) . |
| 404165334 A | * | 6/1992 | (JP) . |
| 4-204719 | | 7/1992 | (JP) . |
| 4-234735 | | 8/1992 | (JP) . |
| 6-45682 | | 2/1994 | (JP) . |
| 6204948 | * | 7/1994 | (JP) . |
| 07015055 A | * | 1/1995 | (JP) . |

OTHER PUBLICATIONS

Zirngble, M; Electronics Letters, vol. 27, #7, pp 560–561, Mar. 28, 1991.*

* cited by examiner

*Primary Examiner*—Nelson Moskowitz
(74) *Attorney, Agent, or Firm*—Antonelli, Terry, Stout & Kraus, LLP

(57) ABSTRACT

In a light amplification apparatus in which a part of a light output from a light amplification medium is transmitted through a branching means to a light detection means so that light power of the light output is detected by the light detection means whereby at least one of an excitation source and a return means is controlled through a control means so that light branch from a branching means is returned as a return light to the light amplification medium through the branching means again in a state in which light power is adjusted by the return means, and, as a result, the light power of the light output from the light amplification medium can be kept in a desired value while the occurrence of a light surge is suppressed, a light amplification medium control method and a light amplification apparatus wherein a signal light input can be amplified while the occurrence of a light surge is suppressed by a simple structure and with good control response, and a system using the same.

28 Claims, 21 Drawing Sheets

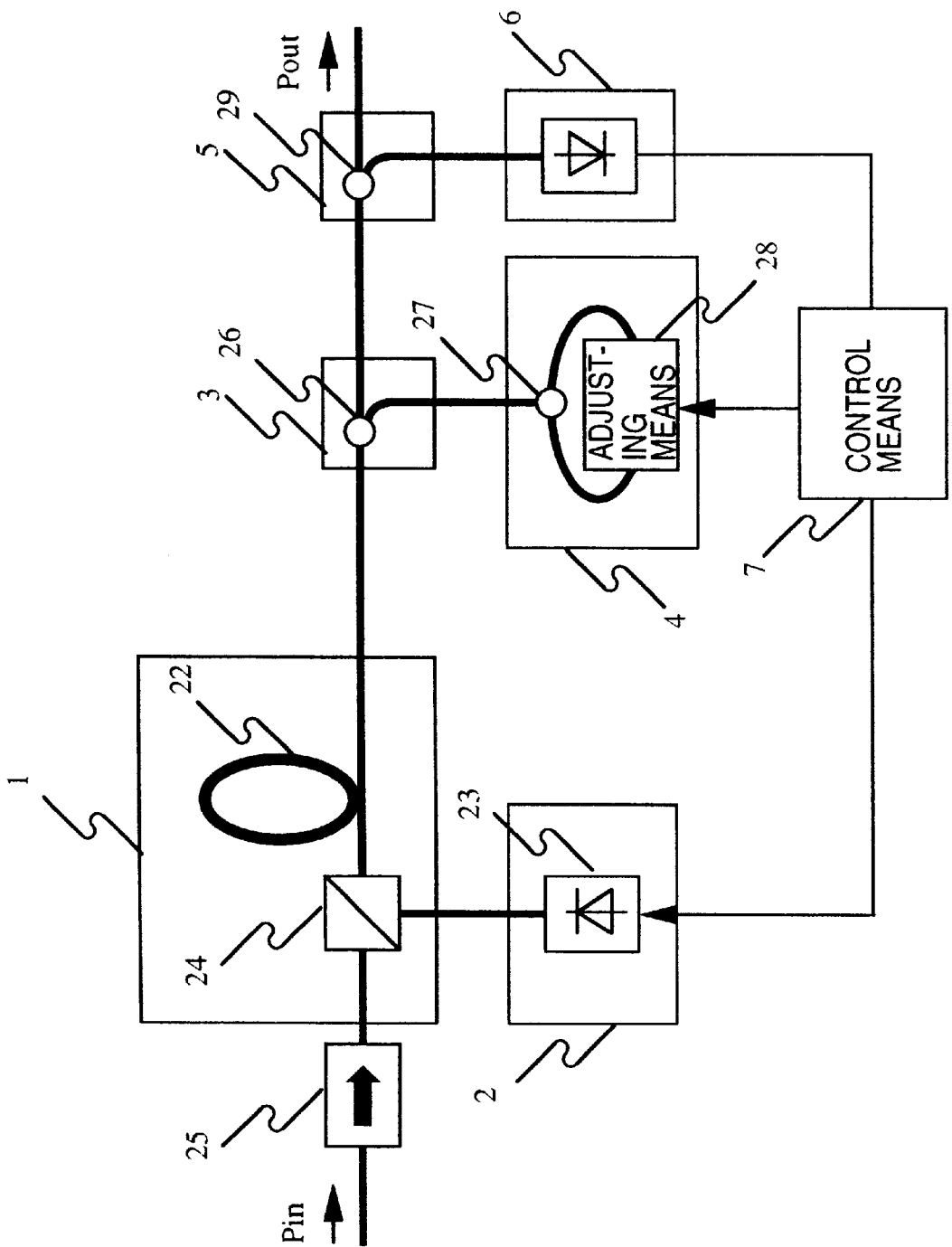

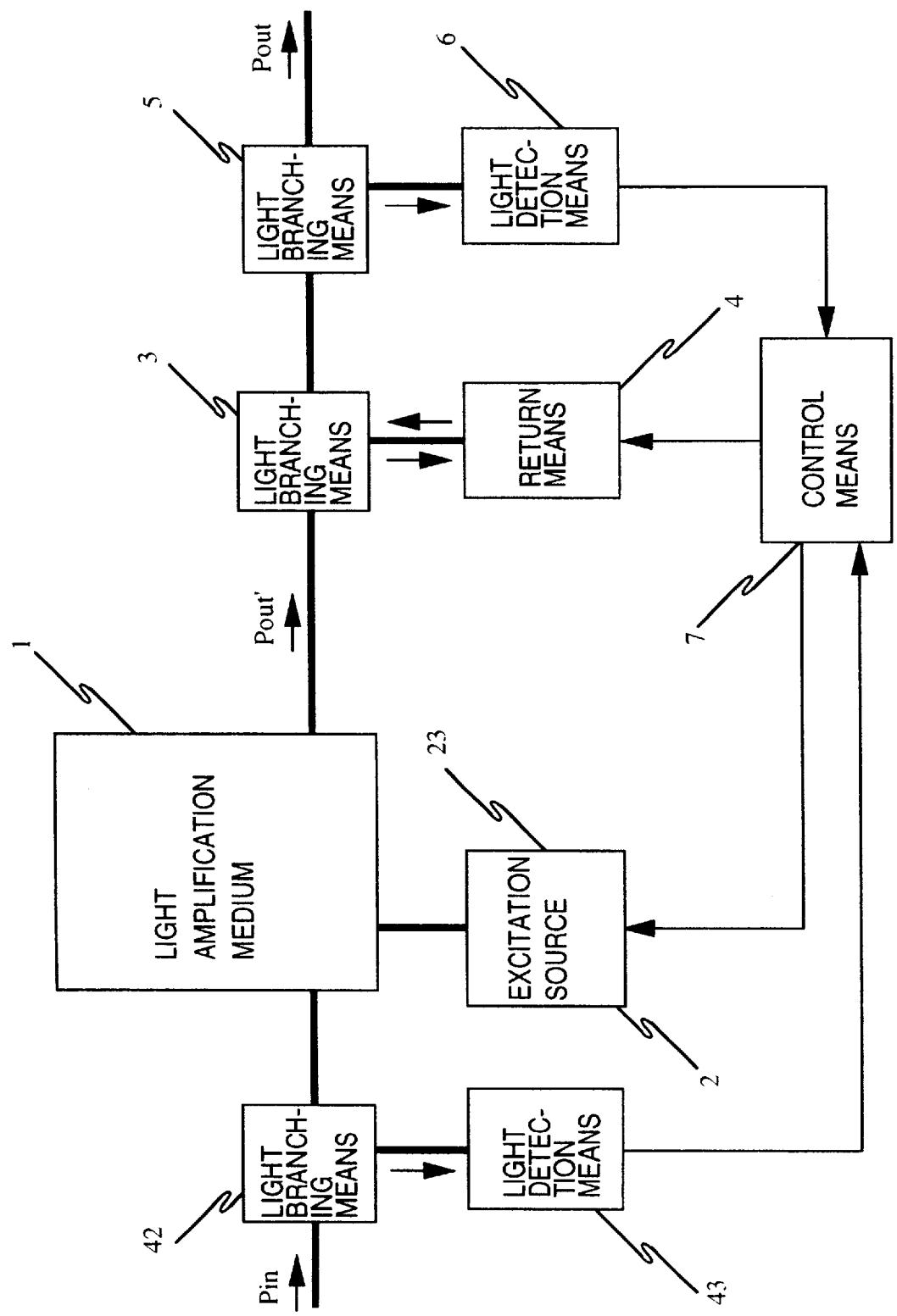

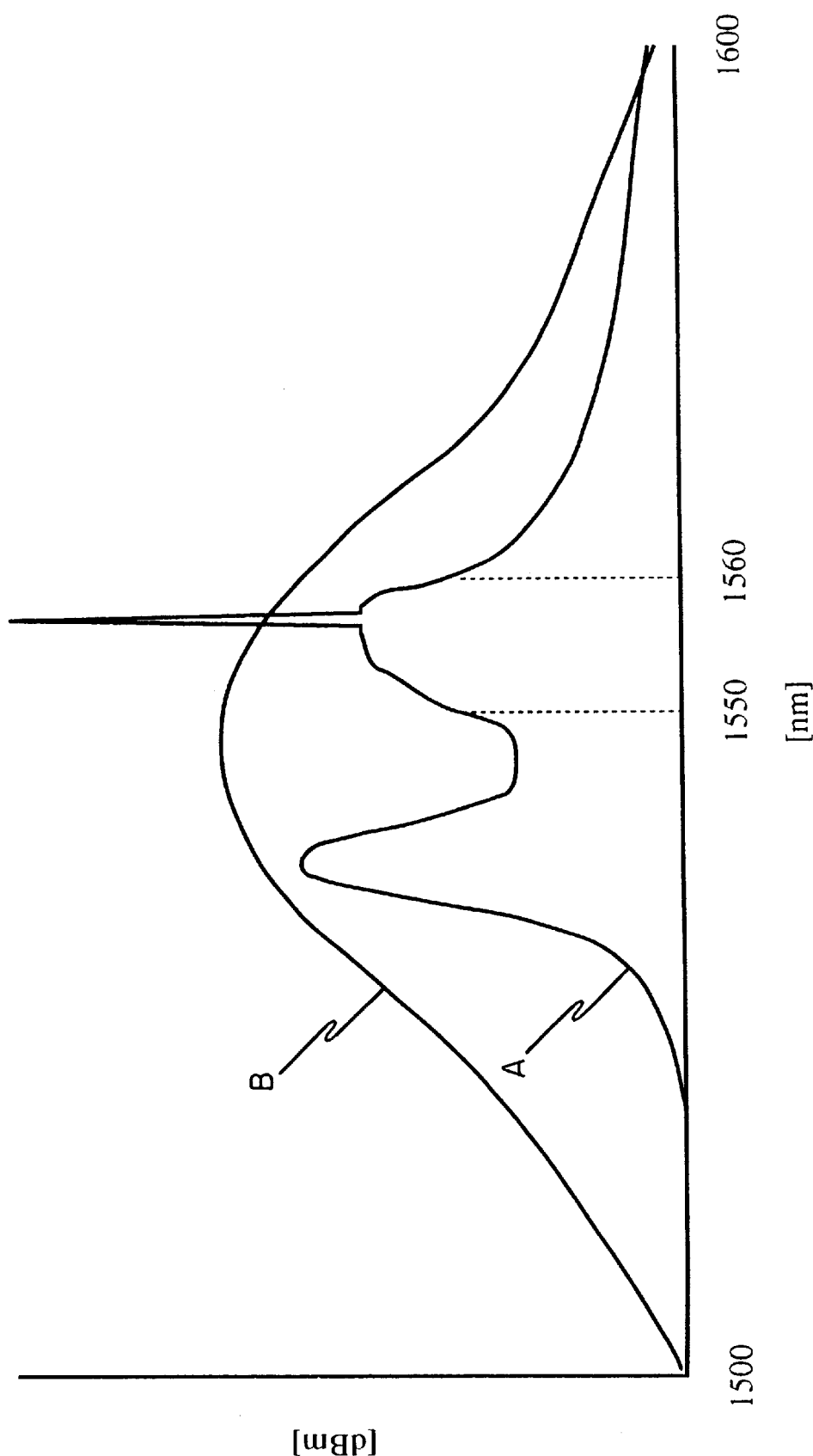

LIGHT AMPLIFICATION MEDIUM CONTROL METHOD, LIGHT AMPLIFICATION APPARATUS AND SYSTEM USING THE SAME

TECHNICAL FIELD

The present invention relates to a light amplification medium control method and a light amplification apparatus used in a light communication system or a light transmission system, and a system using the same. Particularly it relates to a light amplification medium control method and a light amplification apparatus improved in control response to make it possible to suppress the occurrence of a light surge, and a system using the same.

BACKGROUND ART

A light amplifier is generally designed so that it is necessary to suppress a light surge as extremely as possible. The "light surge" used herein means a phenomenon in which signal light of very high gain is outputted from the light amplification apparatus when a signal light input to the light amplification apparatus increases instantaneously. Such a light surge occurs for the following reason. That is, when a signal light input decreases, it is necessary to enlarge the power of excitation light to increase the amplification factor in the light amplification medium in order to obtain a desired light output. Accordingly, in this occasion, large signal light amplification energy is potentially accumulated in the inside of the light amplification medium. If the signal light input increases instantaneously in this state, the signal light suffers the accumulated energy so that the signal light of a very high gain is emitted from the light amplification apparatus. Because the occurrence of a light surge not only brings the breaking of a light-receiving element and the induction of melting of a connector end surface on the light communication terminal side but also brings human trouble (visual trouble) according to circumstances, it is necessary that the occurrence of the light surge is suppressed as extremely as possible. Particularly, when a plurality of light amplification apparatuses are connected multistageously, the situation is more serious. This is because the once generated light surge is amplified successively by the connected light amplification apparatuses so that the amplified light surge may give a death-blow to optical parts constituting each of the light amplification apparatuses.

Heretofore, a measure counter to such a light surge has been described in the paper "Discussion of Light Surge in Multistageous Connection of Light Amplifiers" (Spring Meeting B-941, Institute of Electronics, Information and Communication Engineers of Japan, 1993). FIG. 14A shows the configuration of an experimental system in the countermeasure, and FIG. 14B shows the levels of light outputs from the respective light amplification apparatuses in the case of multistageous connection. As shown in FIG. 14A, the system is configured so that signal light with variable rising time can be emitted from a laser diode (LD) (using a distribution feedback type (DFB) LD module with a mean wavelength of 1.55 $\mu$m) as a signal source by current-driving the LD. The signal light from the LD is successively given to light amplification apparatuses (each having an erbium-containing optical fiber amplifier excited by using a pump laser with a wavelength of 1.48 $\mu$m) AMP1 to AMP5 provided with light attenuators (ATT) disposed prior to the light amplification apparatuses respectively, so that light outputs are obtained from the light amplification apparatuses respectively. On the other hand, the waveform states of the signal light outputs from the light amplification apparatuses can be monitored by a photodiode (PD) through an ATT. It is apparent from FIG. 14B that the light surge can be suppressed as the rising time of the signal light from the LD is elongated and that there is little light surge generated particularly when the rising time is set to be in a value of the order of milliseconds.

In the aforementioned paper, however, only a light surge suppressing method using the rising time control of the signal light input has been disclosed. Accordingly, the application of the light surge suppressing method to a practical light communication system cannot but be limited considerably so that, for example, the method cannot be applied to light surges caused by factors other than the rising of the signal light input. Even in the case where the rising time of the signal light input is controlled, there is a risk that a light surge is induced easily with the instantaneous change of the signal light power caused by the physical vibration or shock given to optical fiber in a light signal transmission state if the physical vibration or shock is given to the optical fiber.

Further, in addition to the aforementioned disadvantage, in order to suppress the light surge in each light amplification apparatus in the prior art, it is necessary to decrease the power of excitation light from the excitation (light) source or to stop the excitation light once. In this occasion, the light surge immediately follows the excitation light power reducing speed so that the light surge cannot be controlled so as to be suppressed. Accordingly, improvement in control response cannot be expected. This is because the light surge suppressing speed is slower than the excitation light power reducing speed though the degree of light surge suppression depends on energy accumulated before the rising of the signal light inputted to the light amplification medium, the rising speed of the signal light and the light power thereof. Accordingly, the excitation light output from the excitation source is stopped temporarily unless the light surge is suppressed to a predetermined value. In other words, this means that there is some vacant period in which the light surge, in fact, cannot be controlled so as to be suppressed effectively only by the excitation source and that the light surge is generated continuously in the vacant period.

Further, in the light amplification apparatus in the prior art, it is necessary to change widely the drive current given to the excitation source so that the light output from the light amplification apparatus is stabilized against the instantaneous change of the signal light input. In the case where the driving current is changed widely, the change in oscillation wavelength of the excitation source causes a failure in stability of the light output and deterioration of S/N in the whole of the light amplification apparatus.

DISCLOSURE OF INVENTION

An object of the present invention is to provide a light amplification medium control method and a light amplification apparatus in which a signal light input can be amplified by a simple configuration while obtaining good control response and suppressing the occurrence of any light surge without deterioration of S/N of an light output, and a system using the same.

In order to achieve the above object of the present invention, in a light amplification apparatus having a light amplification medium, and an excitation source for exciting the light amplification medium, a light amplification medium control method is characterized by making a part of a light output of the light amplification medium branch, and returning the resulting light branch to the light amplification medium in a direction reverse to the direction of the light output.

Further, the above object is achieved by a light amplification medium control method which is characterized by making a part of a light output of the light amplification medium branch, and returning at least the resulting light branch to the light amplification medium in a direction reverse to the direction of the light output at least on the basis of prediction of a light surge.

Further, the above object is achieved by a light amplification medium control method which is characterized by making a part of a light output of the light amplification medium branch, amplifying the resulting light branch on the basis of prediction of a light surge, and returning the amplified light branch to the light amplification medium in a direction reverse to the direction of the light output.

Further, the above object is achieved by a light amplification medium control method which comprises making light with a band width of at least 10 nm in a light amplification band of the light amplification medium act on the light amplification medium to thereby suppress a light surge. As a more preferable embodiment, a light amplification medium control method which is characterized in that the light made to act on the light amplification medium has a band in a range of from 1500 nm to 1600 nm.

Further, the above object is achieved by a light amplification medium control method which comprises making light with a plurality of signal light wavelengths act on the light amplification medium to thereby suppress a light surge.

Further, the above object is achieved by a light amplification medium control method which comprises detecting energy accumulated in the light amplification medium, and positively controlling the light amplification medium to thereby suppress the energy accumulated in the light amplification medium.

Further, the above object is achieved by a light amplification medium control method which comprises detecting a light input introduced into the light amplification medium, and positively controlling the light amplification medium to thereby suppress the energy accumulated in the light amplification medium.

Further, the above object is achieved by a light amplification apparatus comprising: a branching means for making a part of a light output of the light amplification medium branch, and a return means for returning the resulting light branch obtained by the branching means to the light amplification medium in a direction reverse to the direction of the light output.

Further, the above object is achieved by a light amplification apparatus comprising: a branching means for making a part of a light output of the light amplification medium branch; and a return means for returning at least the resulting light branch obtained by the branching means to the light amplification medium in a direction reverse to the direction of the light output on the basis of prediction of a light surge. As a more preferable embodiment, a light amplification apparatus is characterized in that the prediction of the light surge is performed by detecting the light input introduced into the light amplification medium, or by detecting energy accumulated in the light amplification medium.

Further, the above object is achieved by a light amplification apparatus comprising: a branching means for making a part of a light output of the light amplification medium branch; and a return means for amplifying the resulting light branch obtained by the branching means on the basis of prediction of a light surge and returning the amplified light branch to the light amplification medium in a direction reverse to the direction of the light output.

Further, the above object is achieved by a light amplification apparatus comprising: a first branching means for making a part of a light output of the light amplification medium branch; a return means for returning the resulting light branch obtained by the first branching means to the light amplification medium in a direction reverse to the direction of the light output; a second branching means for making a part of the light output of the light amplification medium branch; a light detection means for detecting the resulting light branch obtained by the second branching means; and a control means for controlling at least one of the excitation source and the return means on the basis of light power detected by the light detection means.

Further, the above object is achieved by a light amplification apparatus comprising: a first branching means for making a part of a light output of the light amplification medium branch; a return means for returning the resulting light branch obtained by the first branching means to the light amplification medium through the first branching means in a direction reverse to the direction of the light output; a second branching means for making a part of the light output passed through the first branching means branch; a light detection means for detecting the resulting light branch obtained by the second branching means; and a control means for controlling at least one of the excitation source and the return means on the basis of light power detected by the light detection means.

Further, the above object is achieved by a light amplification apparatus comprising: a first branching means for making a part of a light output of the light amplification medium branch; a return means for returning the resulting light branch obtained by the first branching means to the light amplification medium through the first branching means in a direction reverse to the direction of the light output; a second branching means for making a part of the light output passed through the first branching means branch; a first light detection means for detecting the resulting light branch obtained by the second branching means; a third branching means for making a part of the signal light input branch to the light amplification medium; a second light detection means for detecting the resulting light branch obtained by the third branching means; and a control means for controlling at least one of the excitation source and the return means on the basis of light power detected by the first light detection means and light power detected by the second light detection means.

Further, the above object is achieved by a light amplification apparatus comprising: a first branching means for making a part of a light output of the light amplification medium branch; a return means for returning the resulting light branch obtained by the first branching means to the light amplification medium through the first branching means in a direction reverse to the direction of the light output; a second branching means for making a part of the light output passed through the first branching means branch; a third branching means for making a part of the resulting light branch obtained by the second branching means further branch; a first light detection means for detecting light through the third branching means; a second light detection means for detecting the resulting light branch obtained by the third branching means through a light filter; and a control means for controlling at least one of the excitation source and the return means on the basis of light power detected by the first light detection means and light power detected by the second light detection means.

Further, the above object is achieved by a light amplification apparatus comprising, as main constituent elements, a light amplification medium, and an excitation source for exciting the light amplification medium, and further comprising a first branching means for making a part of a light output of the light amplification medium branch, a return means for returning the resulting light branch obtained by the first branching means to the light amplification medium through the first branching means in a direction reverse to the direction of the light output, a second branching means for making a part of the light output passed through the first branching means branch, a light detection means for detecting the resulting light branch obtained by the second branching means, and a control means for controlling at least one of the excitation source and the return means on the basis of light power detected by the light detection means, wherein: the first branching means is constituted as a light coupler; and the return means is constituted by a light coupler for making the resulting light branch obtained by the first branching means branch into two directions, and an adjusting means for adjusting light power of the resulting two-directional light branches obtained by the light coupler and returning the adjusted two-directional light branches in reverse directions through the light coupler.

Further, the above object is achieved by a light amplification apparatus comprising, as main constituent elements, a light amplification medium, and an excitation source for exciting the light amplification medium, and further comprising a first branching means for making a part of a light output of the light amplification medium branch, a return means for returning the resulting light branch obtained by the first branching means to the light amplification medium through the first branching means in a direction reverse to the direction of the light output, a second branching means for making a part of the light output passed through the first branching means branch, a light detection means for detecting the resulting light branch obtained by the second branching means, a third branching means for making a part of the signal light input branch to the light amplification medium, a light detection means for detecting the resulting light branch obtained by the third branching means, and a control means for controlling at least one of the excitation source and the return means on the basis of light power detected by the light detection means, wherein: the first branching means is constituted as a light coupler; and the return means is constituted by a light coupler for making the resulting light branch obtained by the first branching means branch into two directions, and an adjusting means for adjusting light power of the resulting two-directional light branches obtained by the light coupler and returning the adjusted two-directional light branches in reverse directions through the light coupler.

Further, the above object is achieved by a light amplification apparatus comprising, as main constituent elements, a light amplification medium, and an excitation source for exciting the light amplification medium, and further comprising a first branching means for making a part of a light output of the light amplification medium branch, a return means for returning the resulting light branch obtained by the first branching means to the light amplification medium through the first branching means in a direction reverse to the direction of the light output, a second branching means for making a part of the light output passed through the first branching means branch, a third branching means for making a part of the resulting light branch obtained by the second branching means further branch, a first light detection means for detecting light through the third branching means, a second light detection means for detecting the resulting light branch obtained by the third branching means through a light filter, and a control means for controlling at least one of the excitation source and the return means on the basis of detected light power, wherein: each of the first and second branching means is constituted as a light coupler; the light filter is constituted by a low-pass filter or a high-pass filter; and the return means is constituted by a light coupler for making the resulting light branch obtained by the first branching means branch into two directions, and an adjusting means for adjusting light power of the resulting two-directional light branches obtained by the light coupler and returning the adjusted two-directional light branches in reverse directions through the light coupler.

Further, the above object is achieved by a light amplification apparatus comprising, as main constituent elements, a light amplification medium, and an excitation source for exciting the light amplification medium, and further comprising a first branching means for making a part of a light output of the light amplification medium branch, a return means for returning the resulting light branch obtained by the first branching means to the light amplification medium through the first branching means in a direction reverse to the direction of the light output, a second branching means for making a part of the light output passed through the first branching means branch, a light detection means for detecting the resulting light branch obtained by the second branching means, and a control means for controlling at least one of the excitation source and the return means on the basis of light power detected by the light detection means, wherein: the first branching means is constituted as a light coupler; and the return means is constituted by an adjusting means for adjusting light power of the resulting light branch obtained by the first branching means, and a reflection means for reflecting the light adjusted by the adjusting means in a reverse direction and returning the reflected light in a reverse direction through the adjusting means.

Further, the above object is achieved by a light amplification apparatus comprising, as main constituent elements, a light amplification medium, and an excitation source for exciting the light amplification medium, and further comprising a first branching means for making a part of a light output of the light amplification medium branch, a return means for returning the resulting light branch obtained by the first branching means to the light amplification medium through the first branching means in a direction reverse to the direction of the light output, a second branching means for making a part of the light output passed through the first branching means branch, a light detection means for detecting the resulting light branch obtained by the second branching means, a third branching means for making a part of the signal light input branch to the light amplification medium, a light detection means for detecting the resulting light branch obtained by the third branching means, and a control means for controlling at least one of the excitation source and the return means on the basis of light power from the light detection means, wherein: the first branching means is constituted as a light coupler; and the return means includes an adjusting means for adjusting light power of the resulting light branch obtained by the first branching means, and a reflection means for reflecting the light adjusted by the adjusting means in a reverse direction and returning the reflected light in a reverse direction through the adjusting means.

Further, the above object is achieved by a light amplification apparatus comprising, as main constituent elements, a light amplification medium, and an excitation source for exciting the light amplification medium, and further comprising a first branching means for making a part of a light output of the light amplification medium branch, a return means for returning the resulting light branch obtained by the first branching means to the light amplification medium through the first branching means in a direction reverse to the direction of the light output, a second branching means for making a part of the light output passed through the first branching means branch, a light detection means for detecting the resulting light branch obtained by the second branching means, and a control means for controlling at least one of the excitation source and the return means on the basis of light power detected by the light detection means, wherein the control means includes a comparator for detecting a deviation of light power detected by the first detection means from a predetermined reference value as an error signal, and a selector for selecting the error signal as a suppression control signal to the return means or as an excitation control signal to the excitation source, on the basis of the polarity of the error signal from the comparator.

Further, the above object is achieved by a light amplification apparatus comprising, as main constituent elements, a light amplification medium, and an excitation source for exciting the light amplification medium, and further comprising a first branching means for making a part of a light output of the light amplification medium branch, a return means for returning the resulting light branch obtained by the first branching means to the light amplification medium through the first branching means in a direction reverse to the direction of the light output, a second branching means for making a part of the light output through the first branching means branch, a light detection means for detecting the resulting light branch obtained by the second branching means, a third branching means for making a part of the signal light input branch to the light amplification medium, a light detection means for detecting the resulting light branch obtained by the third branching means, and a control means for controlling at least one of the excitation source and the return means on the basis of light power detected by the light detection means, wherein the control means includes a comparator for detecting a deviation of light power detected by the first detection means from a predetermined reference value as an error signal and transmitting the error signal as an excitation control signal to the excitation source, a comparator for detecting a deviation of light power detected by the second detection means from a predetermined reference value as an error signal, and a selector for determining, on the basis of the polarity of the error signal from the comparator, whether a suppression control signal is to be transmitted to the return means or not.

Further, the above object is achieved by a light amplification apparatus comprising, as main constituent elements, a light amplification medium, and an excitation source for exciting the light amplification medium, and further comprising a first branching means for making a part of a light output of the light amplification medium branch, a return means for returning the resulting light branch obtained by the first branching means to the light amplification medium through the first branching means in a direction reverse to the direction of the light output, a second branching means for making a part of the light output passed through the first branching means branch, a third branching means for making a part of the resulting light branch obtained by the second branching means further branch, a light detection means for detecting light through the third branching means, a second light detection means for detection through the third branching means through a light filter, and a control means for controlling at least one of the excitation source and the return means on the basis of light power from the first light detection means and light power from the second light detection means, wherein the control means is constituted by a comparator for detecting a deviation of light power detected by the first detection means from a predetermined reference value as an error signal and transmitting the error signal as an excitation control signal to the excitation source, a comparator for detecting a deviation of light power detected by the second detection means from a predetermined reference value as an error signal, and a selector for determining, on the basis of the polarity of the error signal from the comparator, whether a suppression control signal is to be transmitted to the return means or not.

Further, the above object is achieved by a light amplification apparatus comprising, as main constituent elements, a light amplification medium, and an excitation source for exciting the light amplification medium, and further comprising a first branching means for making a part of a light output of the light amplification medium branch, a return means for returning the resulting light branch obtained by the first branching means to the light amplification medium through the first branching means in a direction reverse to the direction of the light output, a second branching means for making a part of the return light from the return means to the first branching means branch, a first light detection means for detecting the resulting light branch obtained by the second branching means, a third branching means for making a part of the resulting return light returned to the light amplification medium and amplified by the light amplification medium branch, a second light detection means for detecting the resulting light branch obtained by the third branching means, and a control means for controlling at least one of the excitation source and the return means on the basis of light power detected by the first light detection means and light power detected by the second light detection means.

Further, the above object is achieved by a light amplification apparatus comprising, as main constituent elements, a light amplification medium, and an excitation source for exciting the light amplification medium, and further comprising a first branching means for making a part of a light output of the light amplification medium branch, a return means for returning the resulting light branch obtained by the first branching means to the light amplification medium through the first branching means in a direction reverse to the direction of the light output, a second branching means for making a part of the return light from the return means to the first branching means branch, a first light detection means for detecting the resulting light branch obtained by the second branching means, a third branching means for making a part of the resulting return light returned to the light amplification medium and amplified by the light amplification medium branch, a second light detection means for detecting the resulting light branch obtained by the third branching means, and a control means for controlling at least one of the excitation source and the return means on the basis of light power detected by the first light detection means and light power detected by the second light detection means, wherein the control means is constituted by a divider for calculating a ratio of light power between light power detected by the first light detection means and light power detected by the second light detection means, a comparator for detecting a deviation of the ratio of light power obtained by the divider from a predetermined reference value as an error signal, and a selector for selecting the error signal as a suppression control signal to the return means or as an excitation control signal to the excitation source on the basis of the polarity of the error signal from the comparator.

Further, the above object is achieved by a light transmission system comprising a light transmitter for transmitting signal light, a transmission optical fiber for transmitting the light signal transmitted from the transmitter, light amplifiers, and a light receiver for receiving the signal light from the transmission optical fiber, wherein at least one of the light amplifiers is a light amplification apparatus defined in Claim 9.

BRIEF DESCRIPTION OF THE DRAWINGS

FIG. 4 is a diagram showing a specific configuration of an example of the light amplification apparatus depicted in FIG. 1;

FIG. 16 is a basic block diagram of a light amplification apparatus according to the present invention;

FIG. 23 is a graph showing a specific example of light spectrum of the return light in the present invention.

BEST MODE FOR CARRYING OUT THE INVENTION

The present invention will be described below with reference to the accompanying drawings.

Prior to the specific description of the present invention, the theoretical background thereof will be described first as follows.

Figure 3:
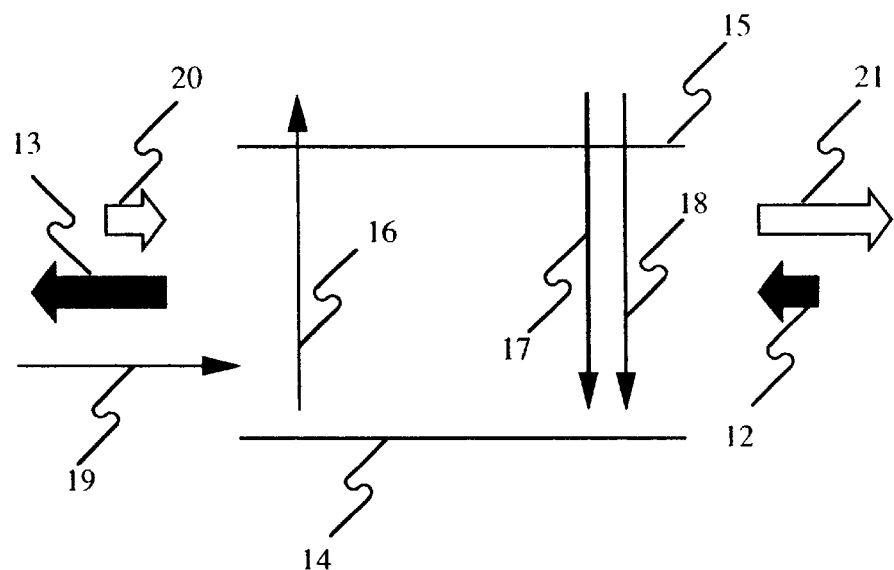
FIG. 3 is a diagram for explaining the theoretical background of the present invention.

That is, FIG. 3 typically shows the function of a light amplification medium in the case where a part of the light output from the light amplification medium returns into the light amplification medium in a direction reserve to the light output. As shown in FIG. 3, when excitation light as an excitation source input 19 is introduced into the light amplification medium, the light amplification medium is subjected to excitation absorption 16 so that atoms in charge of light amplification are activated and the energy level thereof is shifted from a base level 14 to an excitation level 15. If a signal light input 20 is introduced into the light amplification medium in this condition, the light amplification medium is subjected to induced emission 18 so that the light power thereof is increased. As a result, a light output 21 is outputted from the light amplification medium in a state in which the light power has been increased. To keep desired power of the light output 21 even in the case where the signal light input 20 is lowered, it is necessary to activate atoms in charge of light amplification by increasing the light power of the excitation source input 19. Large energy is however accumulated into the light amplification medium 1 because of the increase of the light power. If the signal light input 20 increases instantaneously in this condition, the large energy accumulated is consumed by the induced emission 18 even in the case where the excitation source input 19 is stopped. As a result, the light power of the light output 21 becomes excessive, that is, a light surge is generated. To suppress the light surge effectively, it is thought of that return light based on the light output 21 is introduced into the light amplification medium. This thought is based on the fact that the return light input 12 to the light amplification medium can forcedly generate induced emission 18 by the same function as the function of the signal light input 20 because return light contains the same wavelength as light subjected to induced emission. In other words, accumulated energy as a cause of occurrence of the light surge is forcedly consumed in the light amplification medium by the return light, so that the accumulated energy conventionally consumed by the signal light input is forcedly reduced and, accordingly, an excess of the light output 21, that is, a light surge which could not be suppressed only by the stopping of the excitation light can be suppressed effectively with good control response.

Figure 1:
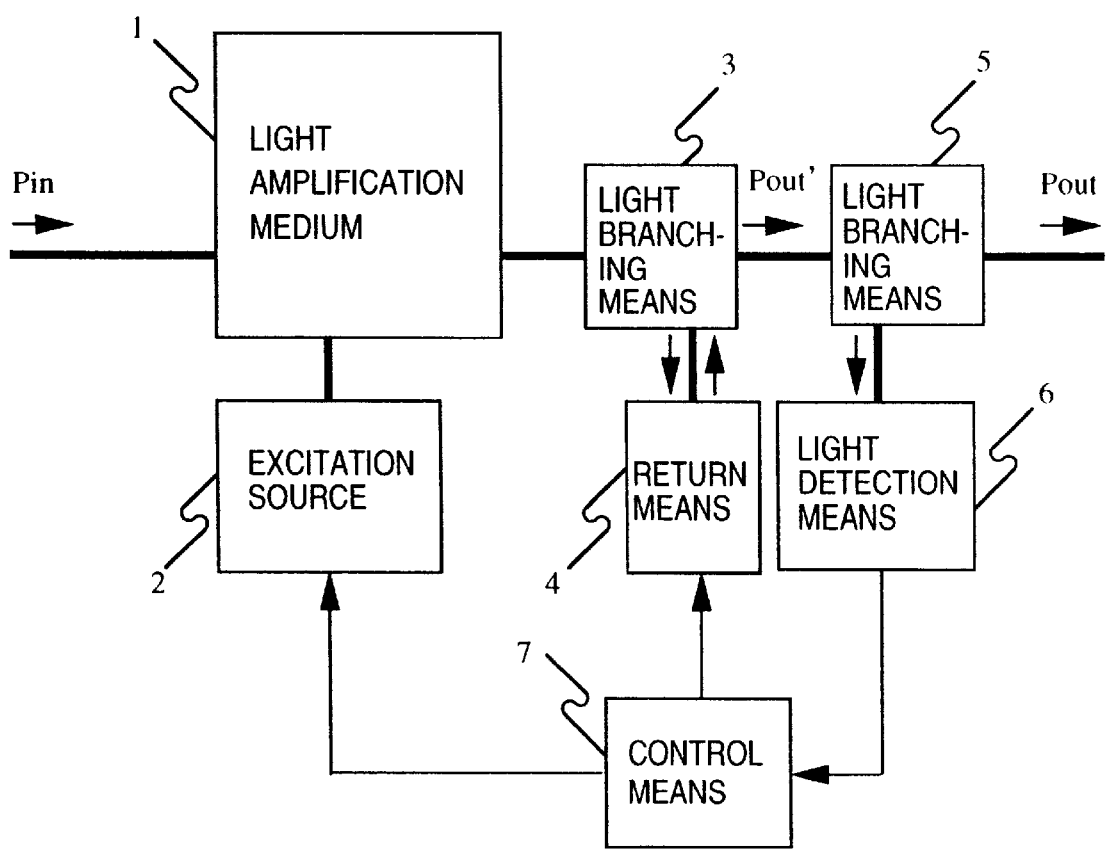
FIG. 1 is a basic block diagram of a light amplification apparatus according to the present invention.

Now, the present invention is described specifically. FIG. 1 shows a first basic block diagram of the light amplification apparatus according to the present invention. As shown in FIG. 1, the light amplification medium 1 is generally designed so that, in a state in which the light amplification medium 1 can be excited by excitation light from an excitation source 2, a signal light input Pin from the outside is light-amplified by the light amplification medium 1 and the amplified light is taken out as a light output Pout' mainly containing signal light. In the present invention, the light amplification medium 1 is designed so that a light branching means 3 for generating return light and a light branching means 5 for detecting the light power of the light output Pout' mainly containing signal light are newly inserted into the path of the light output Pout' mainly containing signal light. A part of the light output Pout' mainly containing signal light through the light branching means 3 is made to branch by the light branching means 5, and the light power of the light output Pout mainly containing signal light is detected by a light detection means 6. On the other hand, light through the light branching means 5 is obtained as a light output Pout mainly containing signal light from the light amplification apparatus. On the other hand, a part of the light output Pout' mainly containing signal light from the light amplification medium 1 is made to branch by the light branching means 3, and the light power thereof is controlled so as to be able to be adjusted by the return means 4. Further, the light is returned as return light, through the light branching means 3, to the light amplification medium 1. The control means 7 controls at least one of the excitation source 2 and the return means 4 on the basis of the light power detected by the light detection means 6 so that the light power of the light output Pout mainly containing signal light is kept in a desired value. Incidentally, the light branching means 5 and the light detection means 6 intend to monitor a part of the light output Pout mainly containing signal light, but the effect of the present invention is not eliminated even in the case where light branching means 5 and the light detection means 6 are omitted. Further, the light branching means 5 and the light detection means 6 may be interposed between the light amplification medium 1 and the light branching means 3.

FIG. 4 also shows a specific configuration of an example of the light amplification apparatus depicted in FIG. 1. As shown in FIG. 4, the light amplification medium 1 is formed as an erbium-containing optical fiber 22 provided with a light multiplier 24 provided prior to the erbium-containing optical fiber 22, and the excitation source 2 is formed as an excitation light source 23 of 980 nm. Excitation light from the 980 nm excitation light source 23 is designed so as to be able to be introduced into the erbium-containing optical fiber 22 through the light multiplier 24. Accordingly, after the signal light input Pin from the outside is transmitted through the light isolator 25 and light-amplified by the erbium-containing optical fiber 22, the amplified light is taken out as a light output Pout' mainly containing signal light from the erbium-containing optical fiber 22. A part (10%) of the light output Pout' mainly containing signal light is then made to branch by a light coupler (10:90) 26 which acts as the light branching means 3 and processed by the return means 4. In the return means 4, the light branch from the light coupler 26 is further made to branch into two directions by a light coupler (50:50) 27 and then the two outputs of the light coupler 27 are inputted into the adjusting means 28 from two directions reverse to each other. After the light adjusted by the adjusting means 28 are outputted from two directions reverse to each other and coupled again by the light coupler 27, the coupled light is returned as a return light to the erbium-containing optical fiber 22 through the light coupler 26. Although the return light is light-amplified by the erbium-containing optical fiber 22 and tries to flow back to the input side, the backflow of the return light is prohibited by the light isolator 25.

On the other hand, a part (10%) of the light output Pout' (90% of the whole of Pout') mainly containing signal light through the light branching means 3 is further made to branch by the light coupler (10:90) 29 which acts as the light branching means 5 and the light power thereof is detected by the light detection means 6. Consequently, in this embodiment, the light output Pout mainly containing signal light in the light amplification apparatus is obtained as 81% of the whole light output Pout' mainly containing signal light. The 980 nm excitation light source 23 and the adjusting means 28 are controlled by the control means 7 on the basis of the light power detected by the light detection means 6 as will be described later. Incidentally, either one of the 980 nm excitation light source 23 and the adjusting means 28 may be designed so as to be controlled. Further, the control means 7 may control the 980 nm excitation light source 23 and the adjusting means 28 without the light branching means 5 and the light detection means 6. In the erbium-containing optical fiber 22, the excitation light from the 980 nm excitation light source 23 acts to increase the gain and, on the other hand, the return light from the return means 4 acts to reduce the gain.

Figure 5:
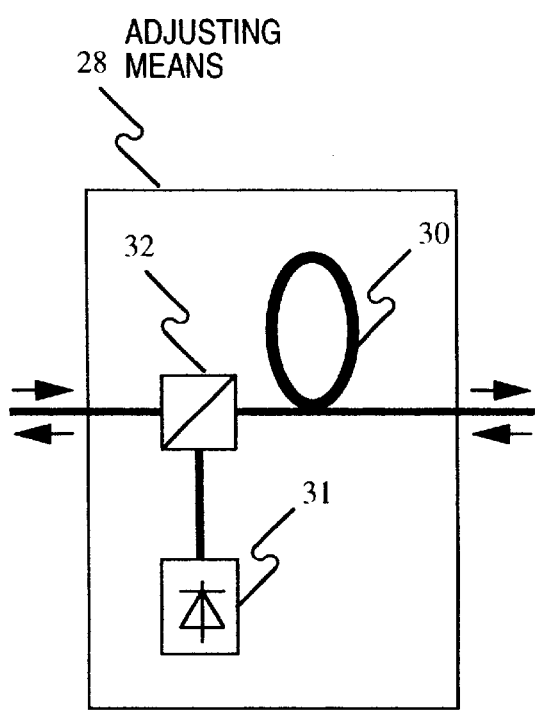
FIG. 5 is a diagram showing a specific configuration of an adjusting means as a constituent element of the feedback means according to the present invention.

Describing the adjusting means 28 now, FIG. 5 shows a specific configuration thereof. As shown in FIG. 5, the adjusting means 28 includes an erbium-containing optical fiber 30, an excitation light source (as which a low-cost low-light-output light source can be used) 31 with an oscillation wavelength of 830 nm, and a light multiplier 32 for introducing excitation light from the excitation light source 31 into the erbium-containing optical fiber 30. In the erbium-containing optical fiber 30, light power inputted from the opposite end sides thereof are adjusted under the amplification factor control based on the excitation light from the excitation light source 31 and outputted from opposite fiber ends and then returned through the light coupler 27 in directions reverse to each other. In this embodiment, the light power of the return light to be required can be adjusted desirably only by the increase/decrease of the excitation light from the excitation light source 31 and, furthermore, the light branch from the light coupler 26 can be used directly as a part of the return light.

The light amplification medium such as erbium-containing optical fiber generally has an amplification/absorption-allowed light wavelength range not smaller than about 20–30 nm. An object of the present invention is to effectively consume the energy unnecessarily accumulated in the light amplification medium such as erbium-containing optical fiber. Accordingly, the return light is preferably light which can include the amplified (absorbed) wavelength of the erbium-containing optical fiber 22. The erbium-containing optical fiber 30 used in the adjusting means 28 in FIG. 5 can send light of a wide wavelength range of about 1520 nm to about 1570 nm as the return light. Curve A in FIG. 23 shows the outline of the light spectrum of the return light thus sent. Although the wavelength band of the semi-conductor laser (LD) used as signal light is generally not larger than about 2 nm, the desired light spectrum range of the return light is at least 5 nm except the signal light (2 nm or less) from the light amplification medium. In this embodiment, the return light has a light spectrum in a range of from about 1550 nm to about 1560 nm. More preferably, as shown by curve B in FIG. 23, the return light has a light spectrum in a range of about 1500 nm to about 1600 nm. Strictly, the return light having the same light spectrum as the light spectrum of the erbium-containing optical fiber 22 is the to have the function sufficient to include the amplified (absorbed) wavelength of the erbium-containing optical fiber 22. Further, as guessed easily, even in the case where, for example, a neodymium-containing optical fiber having a light spectrum in a wavelength band of 1060 nm or 1300 nm or a praseodymium-containing optical fiber or semiconductor light amplification apparatus having a light spectrum in a wavelength band of 1300 nm is used instead of the erbium-containing optical fiber 22 in the light amplification medium 1, it is preferable that the return light has a light spectrum including the respective wavelength band similarly to above. Further, in recent years, there has been discussed wavelength multiplex amplification in which a plurality of rays of the aforementioned signal light (2 nm or less) are multiplexed in the amplification band of the light amplification medium and amplified by one light amplification apparatus. In this case, the present invention is effective because the return light of the light output from the light amplification medium is used to act as return light having a wavelength band wider than the wavelength band (2 nm or less) of the single signal light.

Further, as described above, the light amplification medium such as erbium-containing optical fiber has a causative factor of occurrence of a light surge theoretically. Although the increase in the light intensity of the return light according to the present invention is useful for suppressing the light surge effectively, the excessive increase in the light intensity may contrariwise be a cause of lowering of the amplification gain efficiency which is the original object of the light amplification apparatus. If the adjusting means 28 shown in FIG. 5 is used, a light surge however occurs in the same mechanism as the erbium-containing optical fiber 22 also in the erbium-containing optical fiber 30 in the adjusting means 28 because the light output Pout' mainly containing signal light increases in a moment that the intensity of light increases because of the occurrence of a light surge in the erbium-containing optical fiber 22. That is, in FIG. 5, in an ordinary state, the intensity of the return light can be selected to be in a small value by the adjusting means 28 so that sufficiently effective intensity of return light can be generated only when there is occurrence of any light surge.

Figure 15A:
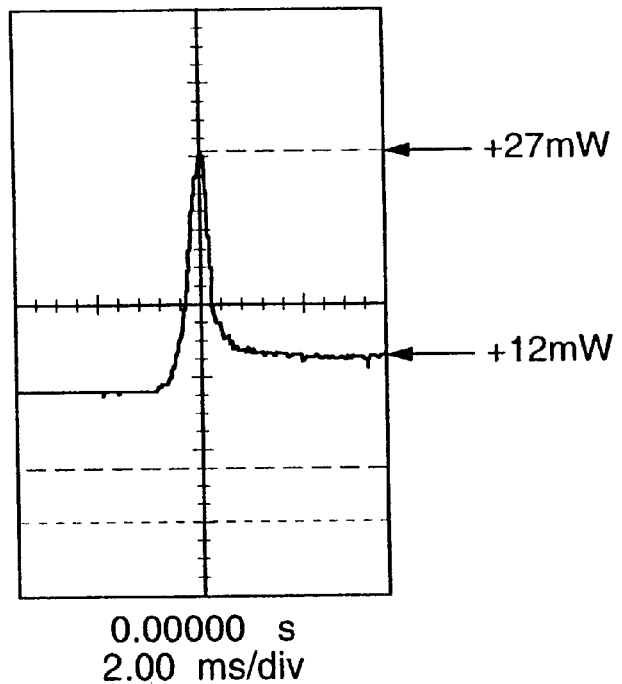
FIG. 15A is a graph showing an example of a light surge generated in the conventional case.
Figure 15B:
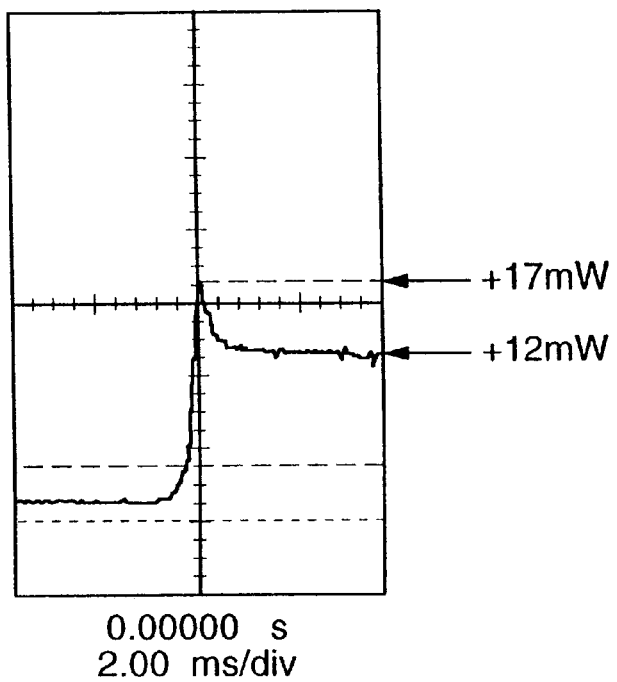
FIG. 15B is a graph showing measured data in the case where the light surge is suppressed by an embodiment of the present invention.

FIG. 15A shows an example of a light surge which occurs in the conventional case, and FIG. 15B shows measured data in the case where the light surge is suppressed by the specific embodiment shown in FIG. 4 and the specific embodiment in FIG. 5. The light surge is suppressed effectively by the effect of the present invention.

Although FIG. 5 shows the case where the length of the erbium-containing optical fiber 30 and the light output power of the 830 nm excitation light source are selected to be about 10 mW and 20 mW respectively, in order to more effectively suppress the light surge, it will do to increase the length of the erbium-containing optical fiber 30 to thereby increase the light output power of the excitation light source or it will do to decrease the branch ratio of the light coupler 29 (for example, 20:80) to thereby increase the light intensity of the return light. Although this embodiment has been described about the case where the oscillation wavelength of the excitation light source is 830 nm, the invention can be applied to the case where an excitation light source having an oscillation wavelength near 530 nm, 660 nm, 980 nm, 1480 nm, or the like, is used so long as the erbium-containing optical fiber 30 can amplify the light. Further, because a low-cost low-output light source can be used as the excitation light source which is used herein as described above, for example, a part of the output of the excitation light source 23 acting on the light amplification medium 1 may be made to branch so that the light branch is introduced into the erbium-containing optical fiber 30.

Incidentally, in the case where the adjusting means 28 is formed as a semiconductor light amplification apparatus, the amplification factor in the semiconductor light amplification apparatus can be controlled on the basis of the increase/decrease of the excitation current to thereby adjust the light power of the return light.

Figure 6:
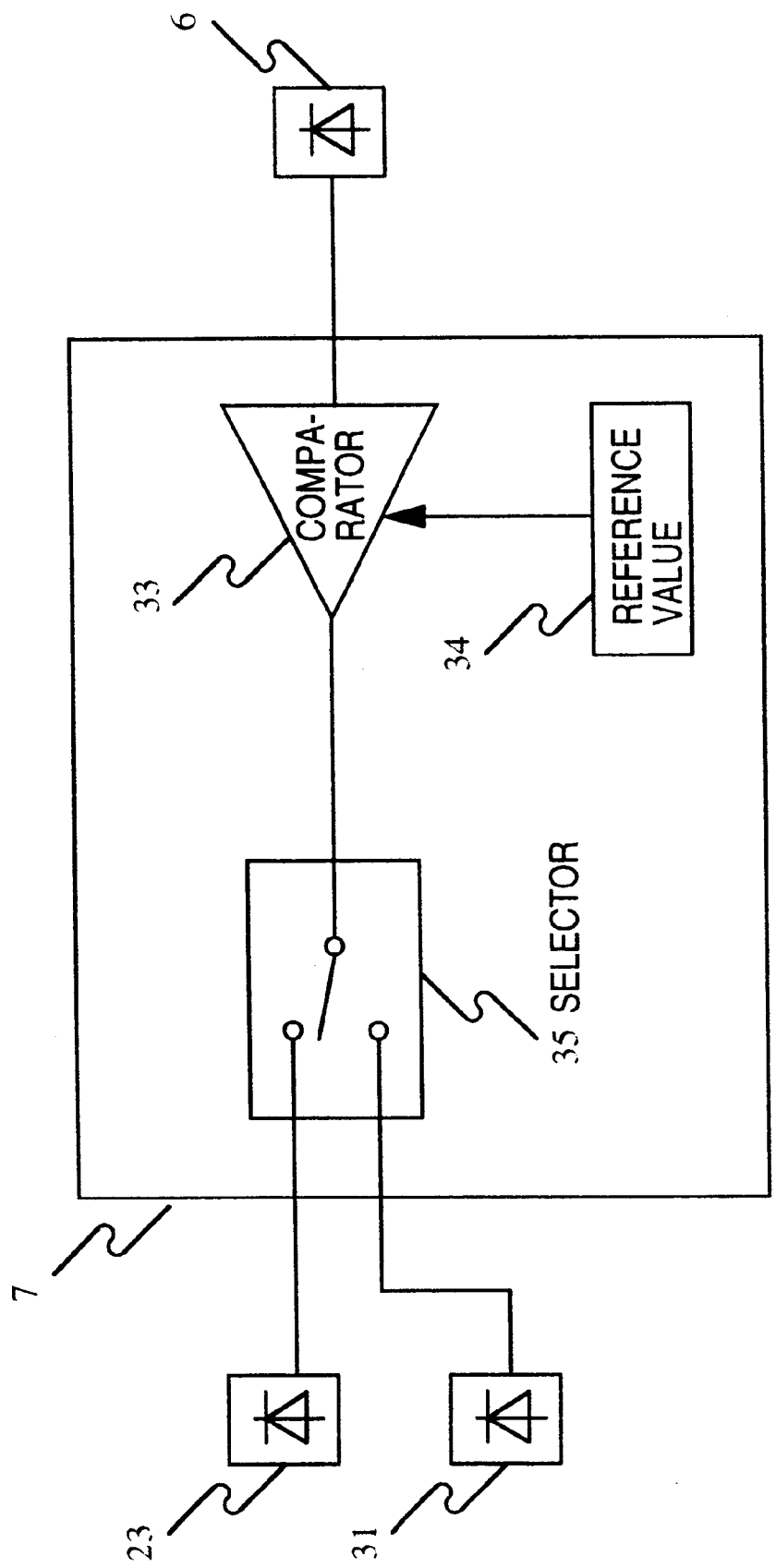
FIG. 6 is a diagram showing a specific configuration of a light amplification medium control method according to the present invention.

Further, describing the control means 7, FIG. 6 shows a specific configuration thereof. As shown in FIG. 6, the control means 7 is configured so that deviation of light power detected by the light detection means 6 from a predetermined reference value 34 is detected as an error signal by a comparator 33 and the error signal (absolute value) is selectively outputted as a suppression control signal to the 830 nm excitation light source 31 or as an excitation control signal to the excitation source 23 by a selector 35 while using the polarity of the error signal as a switching control signal. More specifically, when the light power detected by the light detection means 6 is larger than the reference value 34, the error signal is selectively outputted as a suppression control signal to the 830 nm excitation light source 31 by the selector 35. When the relation of size is reverse, the error signal is selectively outputted as an excitation control signal to the excitation source 23 by the selector 35. Of course, the switching of the selector 35 can be controlled on the basis of the result of the detection of the excitation light from the 980 nm excitation light source 23 without use of the polarity of the error signal as a switching control signal to the selector 35. Generally, the error signal is selectively outputted as an excitation control signal to the 980 nm excitation light source 23 and only excitation light from the 980 nm excitation light source 23 is controlled to be increased or decreased. As described above, even in the case where the excitation light is decreased to zero, the light surge, however, cannot be suppressed. In this case, it is necessary that the return light is introduced into the erbium-containing optical fiber 22 to thereby suppress the light surge. That is, only when the reduction of the excitation light from the 980 nm excitation light source 23 to a value not larger than 0 is detected, the error signal is selectively outputted as a suppression control signal by the selector 35.

As described above, the 830 nm excitation light source 31 and the 980 nm excitation light source 23 act reversely to each other on the light amplification medium 1 in terms of gain. Accordingly, when these light sources 31 and 23 are operated simultaneously, wasteful power is consumed uselessly to cause the increase of electric power consumed by the light amplification apparatus as a whole. When either the 830 nm excitation light source 31 or the 980 nm excitation light source 23 is operated selectively under the control by the control means 7, the increase of consumed electric power can be suppressed. Furthermore, as a result, simultaneous incidence of excitation light from the 980 nm excitation light source 23 into the light amplification medium 1 and return light from the 830 nm excitation light source 31 into the light amplification medium 1 is avoided so that not only the suppressing function due to the return light is improved but also the gain increasing function due to the excitation light is prevented from spoiling. That is, the gain increasing function and the suppressing function never cancel each other, so that the occurrence of a light surge from the light amplification medium 1 can be suppressed while good control response can be obtained.

Figure 7:
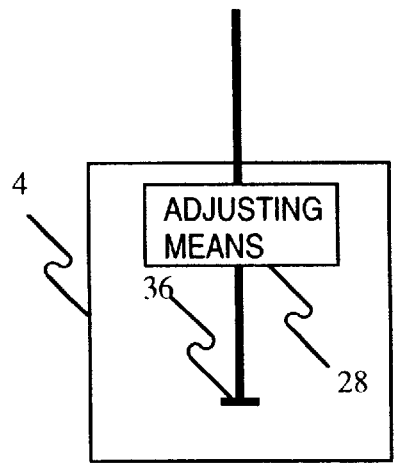
FIG. 7 is a diagram showing another configuration of the feedback means according to the present invention.
Figure 8:
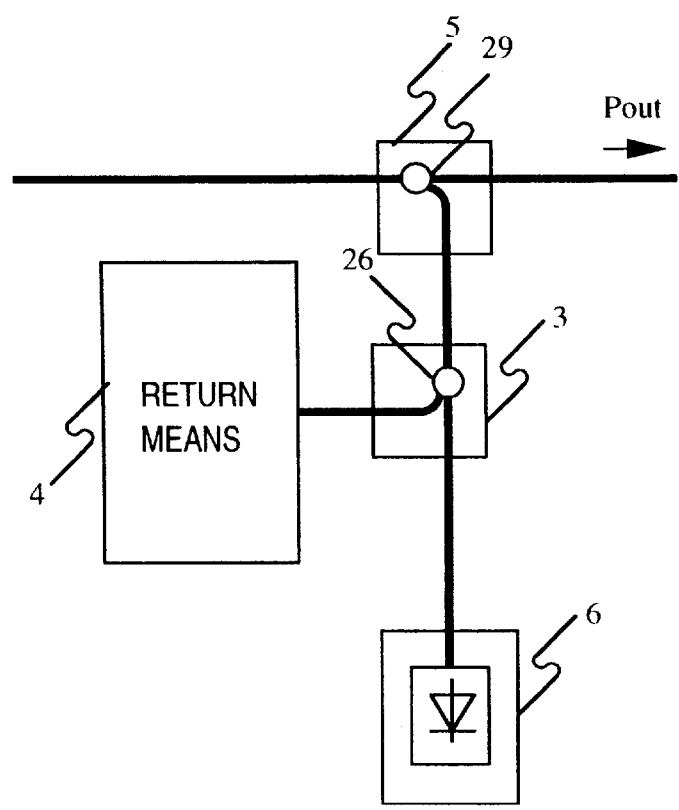
FIG. 8 is a diagram showing a configuration of partly modification of the light amplification apparatus depicted in FIG. 4.
Figure 9:
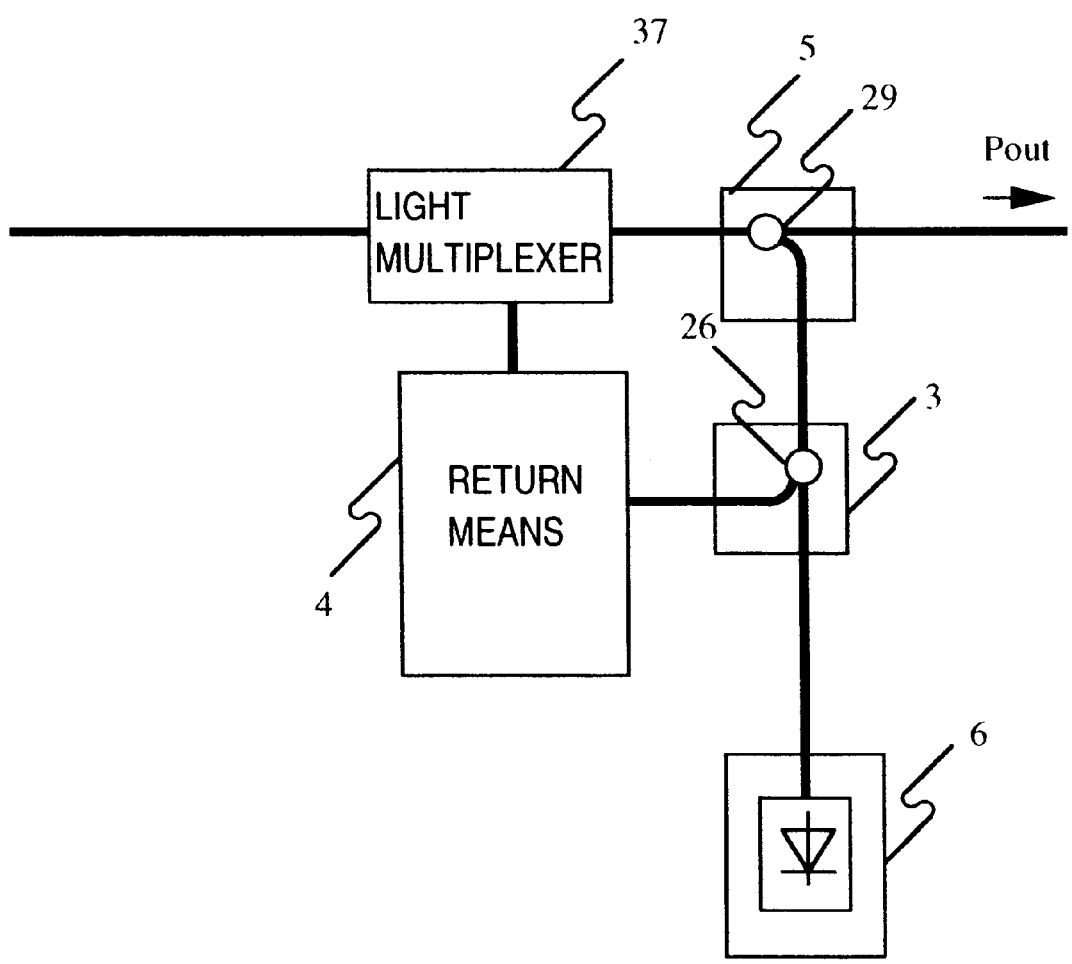
FIG. 9 is a diagram showing a configuration of partly modification of the light amplification apparatus depicted in FIG. 4.

FIG. 7 shows another configuration of the return means 4. As shown in FIG. 7, in this embodiment, the light branch from the light coupler 26 is transmitted directly through the aforementioned adjusting means 28 without the light coupler 27 and reflected in a reverse direction by an end-surface specularly finished fiber 36, that is, a fiber 36 having its end surface finished like a mirror, and then the reflected light is outputted from the return means 4 again through the adjusting means 28. Thus, the return means can be constituted by less number of constituent parts. Incidentally, in order to reduce the intensity of the light branch from the light output Pout', it will do to dispose the light branching means 3 between the light branching means 5 and the light detection means 6 as shown in FIG. 8. Further, as a further modification, as shown in FIG. 9, the return light from the return means 4 may be returned to the light amplification medium 1 through a light multiplexer 37 without the light branching means 3 and 5.

FIG. 16 shows a block diagram showing a second basic configuration of the light amplification apparatus according to the present invention. As shown in FIG. 16, generally, a signal light input Pin from the outside is light-amplified by the light amplification medium 1 in a state in which the light amplification medium 1 can be excited by excitation light from the excitation light source 2, so that the amplified light is taken out as a light output Pout' mainly containing signal light. In the present invention, a light branching means 42 for detecting the light power of the light input Pin is provided newly and a branching means 3 for generating return light and a light branching means 5 for detecting the light power of the light output Pout' mainly containing signal light are provided newly on the path of the light output Pout' mainly containing signal light from the light amplification medium 1. A part of the light input Pin is made to branch by the light branching means 42 so that the light power of the light input Pin is detected by the light detection means 43. On the other hand, the signal light input through the light branching means 42 is light-amplified by the light amplification medium 1 so that the amplified light is taken out as a light output Pout' mainly containing signal light. A part of the light output Pout' mainly containing signal light through the light branching means 3 is made to branch by the light branching means 5 so that the light power of a light output Pout mainly containing signal light is detected by the light detection means 6. On the other hand, the light through the light branching means 5 is obtained as a light output Pout mainly containing signal light from the light amplification apparatus. On the other hand, a part of the light output Pout' mainly containing signal light from the light amplification medium 1 is made to branch by the light branching means 3 so that the light power thereof can be adjusted by the return means 4, and then the light branch is returned as return light to the light amplification medium 1 through the light branching means 3 again. To keep the light power of the light output Pout mainly containing signal light in a desired value, the control means 7 controls at least either one of the excitation source 2 and the return means 4 on the basis of light power detected by at least one of the light detection means 6 and 43. Incidentally, the light branching means 5 and the light detection means 6 are merely provided to monitor a part of the light output Pout mainly containing signal light, and the effect of the present invention is never spoiled even in the case where the light branching means 5 and the light detection means 6 are omitted. Further, the light branching means 5 and the light detection means 6 may be interposed between the light amplification medium 1 and the light branching means 3.

Figure 17:
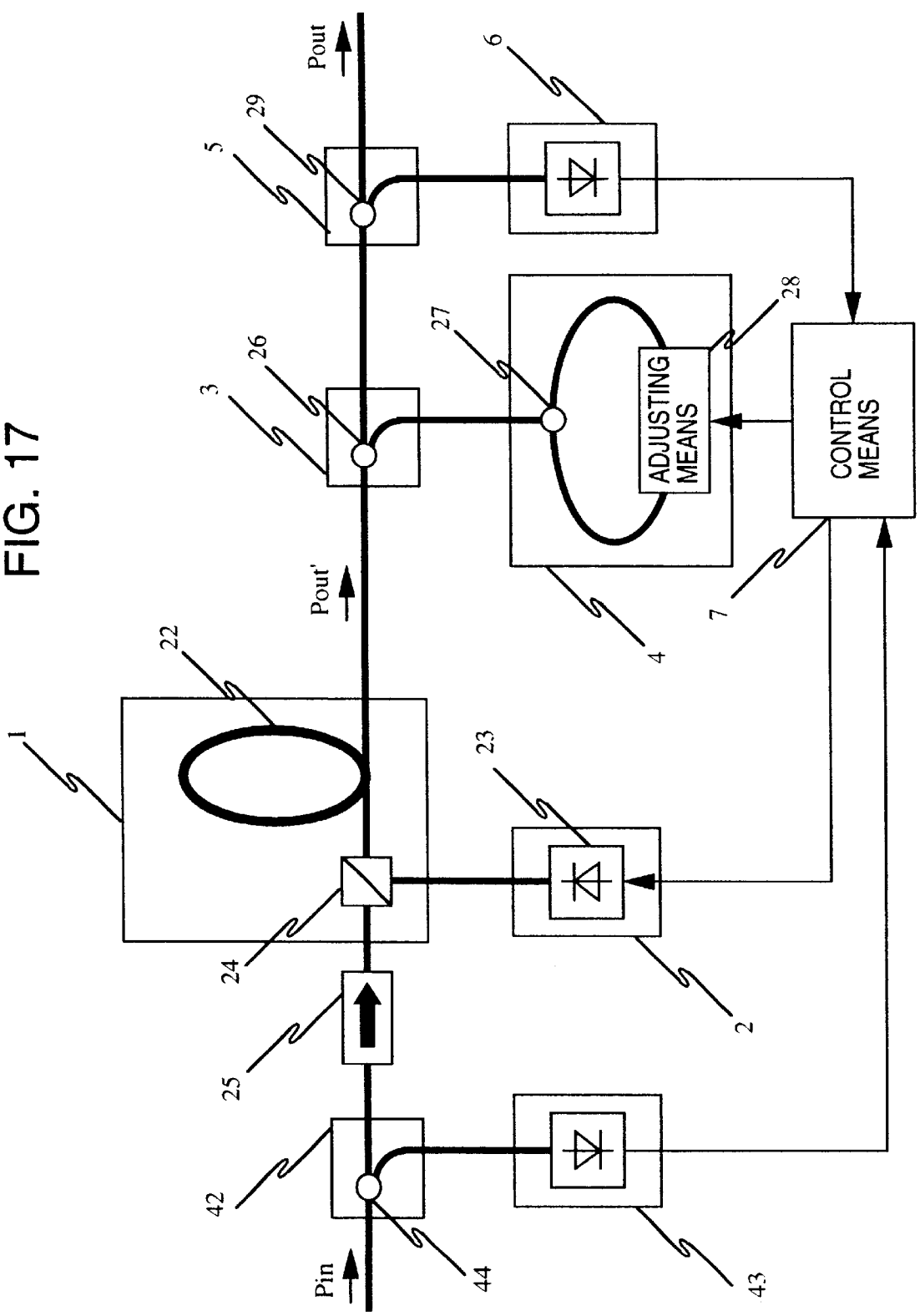
FIG. 17 is a diagram showing a specific configuration of an example of the light amplification apparatus depicted in FIG. 16.

FIG. 17 shows a specific configuration of an example of the light amplification apparatus depicted in FIG. 16. As shown in FIG. 17, a part (10%) of the light input Pin is made to branch by a light coupler (10:90) as the light branching means 42 so that the light branch is detected by the light detection means 43. On the basis of a monitor signal from the light detection means 6 as well as the monitor signal from the light detection means 43, at least one of the 980 nm excitation light source 23 and the adjusting means 28 is controlled by the control means 7.

Figure 18:
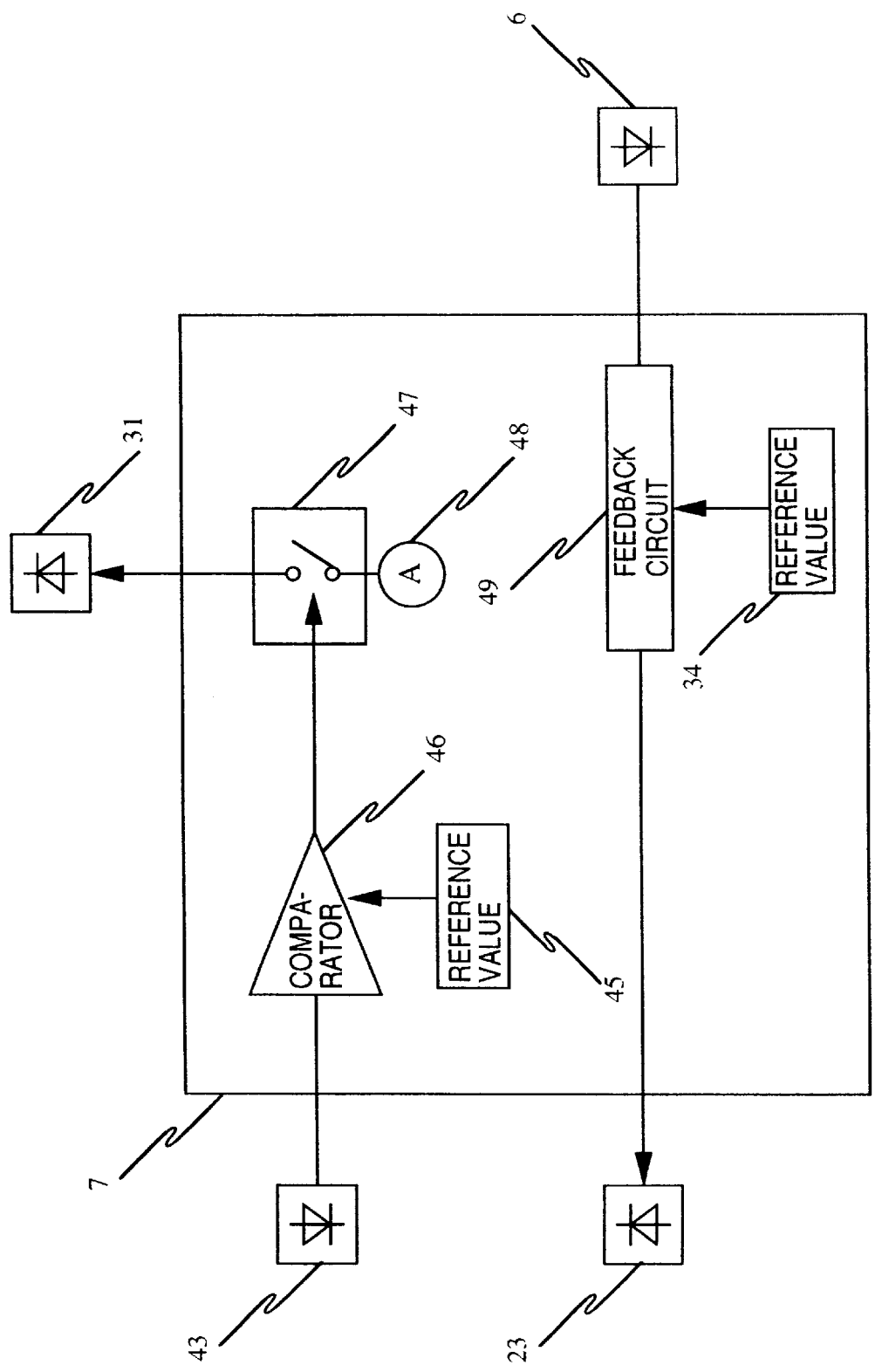
FIG. 18 is a diagram showing a specific configuration of a light amplification medium control method according to the present invention.

FIG. 18 shows in detail a specific circuit configuration of the control means 7 depicted in FIG. 17. The light power detected by the light detection means 43 is compared with a predetermined reference value 45 by a comparator 46 so that a current is supplied from a current source 48 to operate the 830 nm excitation light source 31 in the adjusting means 28 by turning on a switch 47 only when the monitored value of the light input Pin is smaller than the predetermined reference value. On the other hand, a feedback circuit 49 is designed so as to drive the 980 nm excitation light source 23 so that the monitor signal from the light detection means 6 is kept constant on the basis of comparison with a predetermined reference value 34.

As described above, the return light has a function reverse to the function of the excitation light, and excessive light intensity of return light limits the original performance of the light amplification apparatus.

Further, energy accumulated in the erbium-containing optical fiber increases when the light input Pin decreases, so that it is important in terms of light surge prevention that the accumulated energy is consumed efficiently. From demand on a light transmission system, there is however some light amplification apparatus in which the power range of the light input Pin is determined so as to be wide in advance. When the light input Pin is reduced within this range, the accumulated energy can be consumed by increasing the intensity of the return light, but there is the possibility that desired power Pout cannot be obtained contrariwise.

By employing the configuration described above in the specific example, however, the return light can be made to act only when the light input Pin decreases out of the predetermined range so that the light input Pin in the ordinary predetermined range never causes limitation of the function of the excitation light source.

Further, control may be made so that the action of the return light and the reduction of the excitation light are simultaneously performed when the level of the light input Pin becomes lower than the predetermined power level. By this measure, the light surge can be suppressed more effectively because the reduction of the excitation light and the action of the return light are simultaneously performed though the accumulated energy cannot be consumed only by the reduction of the excitation light. Further, it is not always necessary that the return light is made to act only when the light input Pin is lowered out of the predetermined range. For example, control may be made so that the return light is made to act slowly when the light input Pin becomes smaller than a certain value, for example, Pin <−10 dBm.

Figure 19:
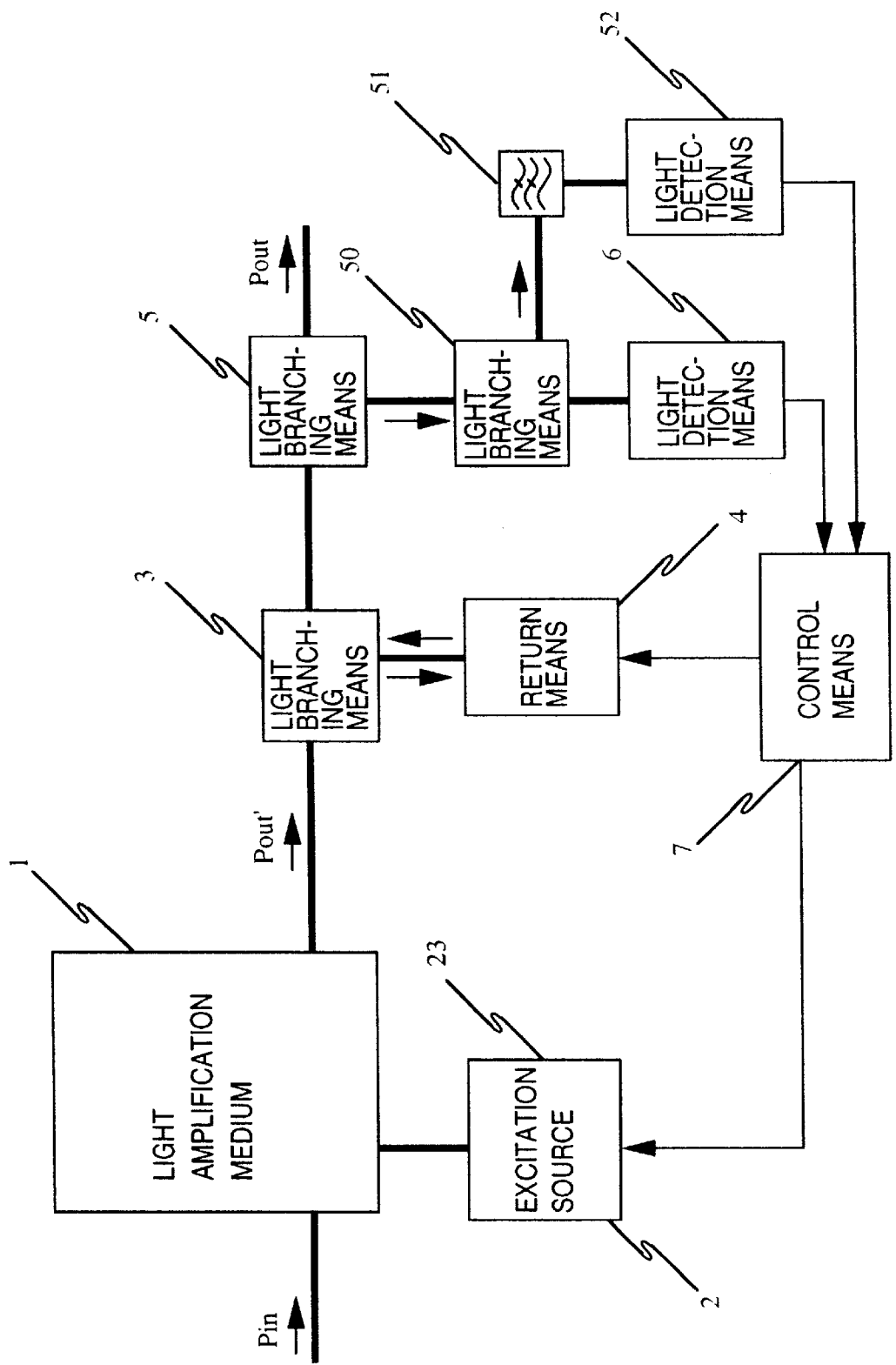
FIG. 19 is a basic block diagram of the light amplification apparatus according to the present invention.

FIG. 19 is a block diagram showing a third basic configuration of the light amplification apparatus according to the present invention. As shown in FIG. 19, generally, a signal input Pin from the outside is light-amplified by the light amplification medium 1 in a state. in which the light amplification medium 1 can be excited by the excitation light from the excitation source 2, so that the amplified light is taken out as a light output Pout' mainly containing signal light. In the present invention, a branching means 3 for generating return light and a light branching means 5 for detecting the light power of the light output Pout' mainly containing signal light are provided newly on the path of the light output Pout' mainly containing signal light. The light output Pout' mainly containing signal light and passed through the light branching means 3 is made to branch by the light branching means 5 so as to be separated into a part which is further made to branch by a light branching means 50 and then the light branch is used to detect the light power of the light output Pout mainly containing the signal light by the light detection means 6, and another part which is passed through the light branching means 50 and then used to detect the light power of components other than the signal light by a light detection means 52 after passed through a light filter 51 which allows only the components other than the signal light to pass. Further, the light passed through the light branching means 5 is obtained as a light output Pout mainly containing signal light from the light amplification apparatus. On the other hand, a part of the light output Pout' mainly containing signal light from the light amplification medium 1 is made to branch by the light branching means 3 and the light power of the light output Pout' is made to be adjusted by the return means 4, and the light branch is returned as return light to the light amplification medium 1 through the light branching means 3 again. To keep the light power of the light output Pout mainly containing signal light in a desired value, the control means 7 controls at least one of the excitation source 2 and the return means 4 on the basis of light power detected by the light detection means 6. Incidentally, the light detection means 6 is merely provided to monitor a part of the light output Pout mainly containing signal light, and the effect of the present invention is never spoiled even in the case where the light detection means 6 is omitted.

Figure 20:
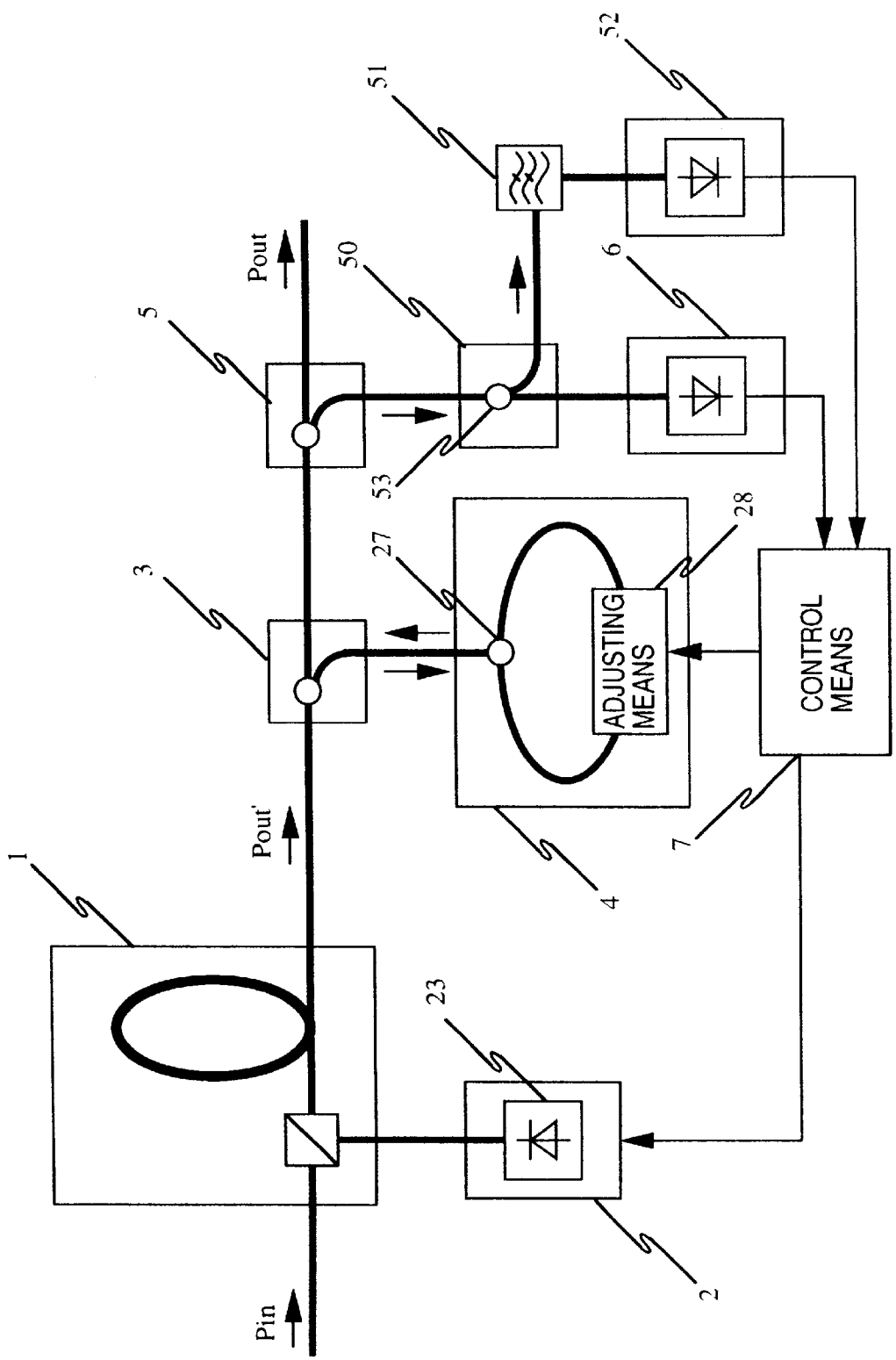
FIG. 20 is a diagram showing a specific configuration of an example of the light amplification apparatus depicted in FIG. 19.

FIG. 20 shows a specific configuration of an example of the light amplification apparatus depicted in FIG. 19. As shown in FIG. 20, light made to branch by the light branching means 5 is further made to branch into two light branches by a light coupler (50:50) 53 as the light branching means 50 so that one light branch is detected by the light detection means 6 and the other light branch is made to pass through a light filter 51 and then detected by a light detection means 52 to thereby detect only the components other than the signal light. When, for example, the wavelength of signal light; is 1550 nm, a low-pass light filter for cutting off light having a wavelength not smaller than 1545 nm may be used because light components other than the signal light exist in a range of from 1520 nm to 1545 nm.

Figure 21:
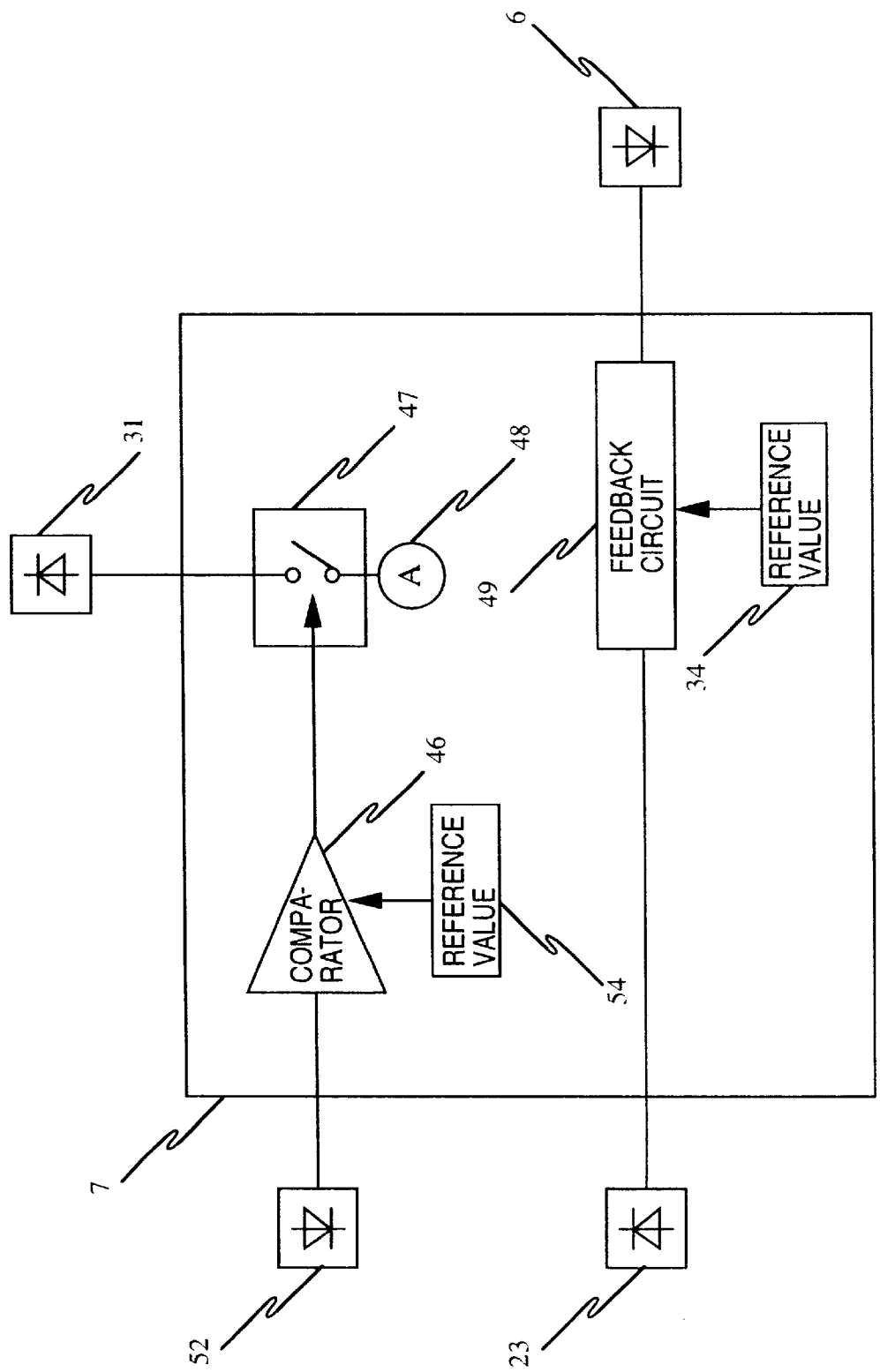
FIG. 21 is a diagram showing a specific configuration of a light amplification medium control means according to the present invention.

Referring to FIG. 21, a specific circuit configuration of the control means 7 depicted in FIG. 19 will be described in detail. The light power detected by the light detection means 52 is compared with a predetermined reference value 54 by a comparator 46 so that a current is supplied from a current source 48 to operate the 830 nm excitation light source 31 in the adjusting means 28 by turning on a switch 47 only when the monitored value of the light detection means 52 is smaller than the predetermined reference value 54. On the other hand, a feedback circuit 49 is designed so as to drive the 980 nm excitation light source 23 so that the monitor signal from the light detection means 6 is kept constant on the basis of comparison with a predetermined reference value 34.

As described above, the return light has a function reverse to the function of the excitation light, and excessive light intensity of return light limits the original performance of the light amplification apparatus.

Further, it is important in terms of light surge prevention that energy accumulated in the erbium-containing optical fiber is kept so as not to be larger than a predetermined value. When signal light is amplified by the light amplification medium 1, the amplified signal light contains light components having wavelengths other than the wavelength of the signal light. The wavelength components other than the signal light exhibit the quantity of accumulated energy.

By employing the configuration described in the aforementioned specific embodiment, the return light can be made to act only when the accumulated energy increases to a value not smaller than a predetermined value, so that the accumulated energy in an ordinary predetermined range never causes limitation of the function of the excitation light source.

Further, the action of the return light and the reduction of the excitation light may be simultaneously performed when the accumulated energy exceeds the predetermined power. By this measure, the light surge can be suppressed more effectively because the action of the return light and the reduction of the excitation light are simultaneously performed though the accumulated energy cannot be consumed only by the reduction of the excitation light.

Because light which has wavelength components other than the signal light and which exhibits the quantity of accumulated energy is emitted not only from the position posterior to the erbium-containing optical fiber but also from the position prior to the erbium-containing optical fiber or from the side of the fiber, the light detection means may be designed so that monitoring of the light exhibiting the quantity of accumulated energy is performed by fetching the light from a branch from the position prior to the erbium-containing optical fiber or from a side thereof.

Figure 2:
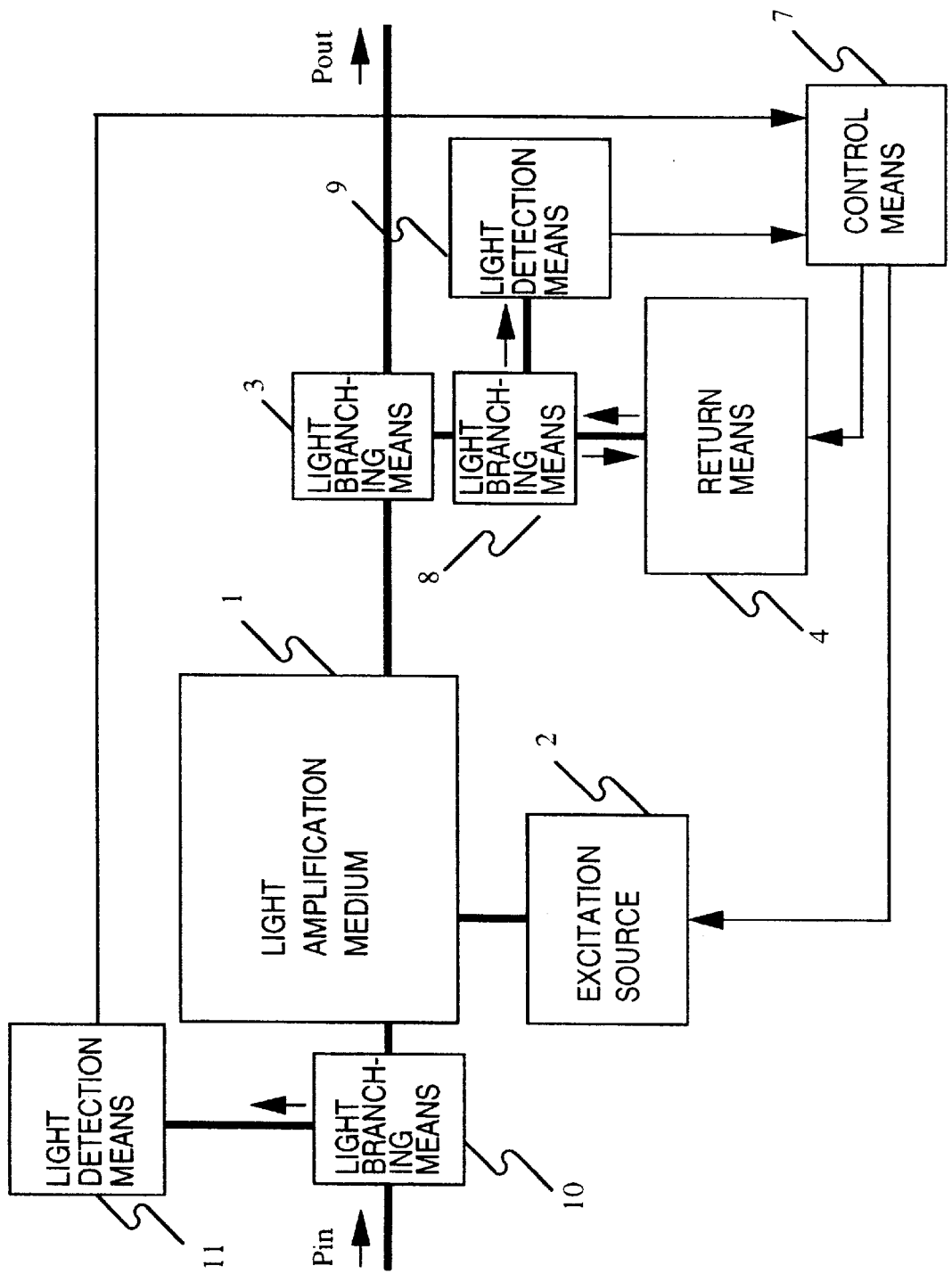
FIG. 2 is a basic block diagram of the light amplification apparatus according to the present invention.
Figure 10:
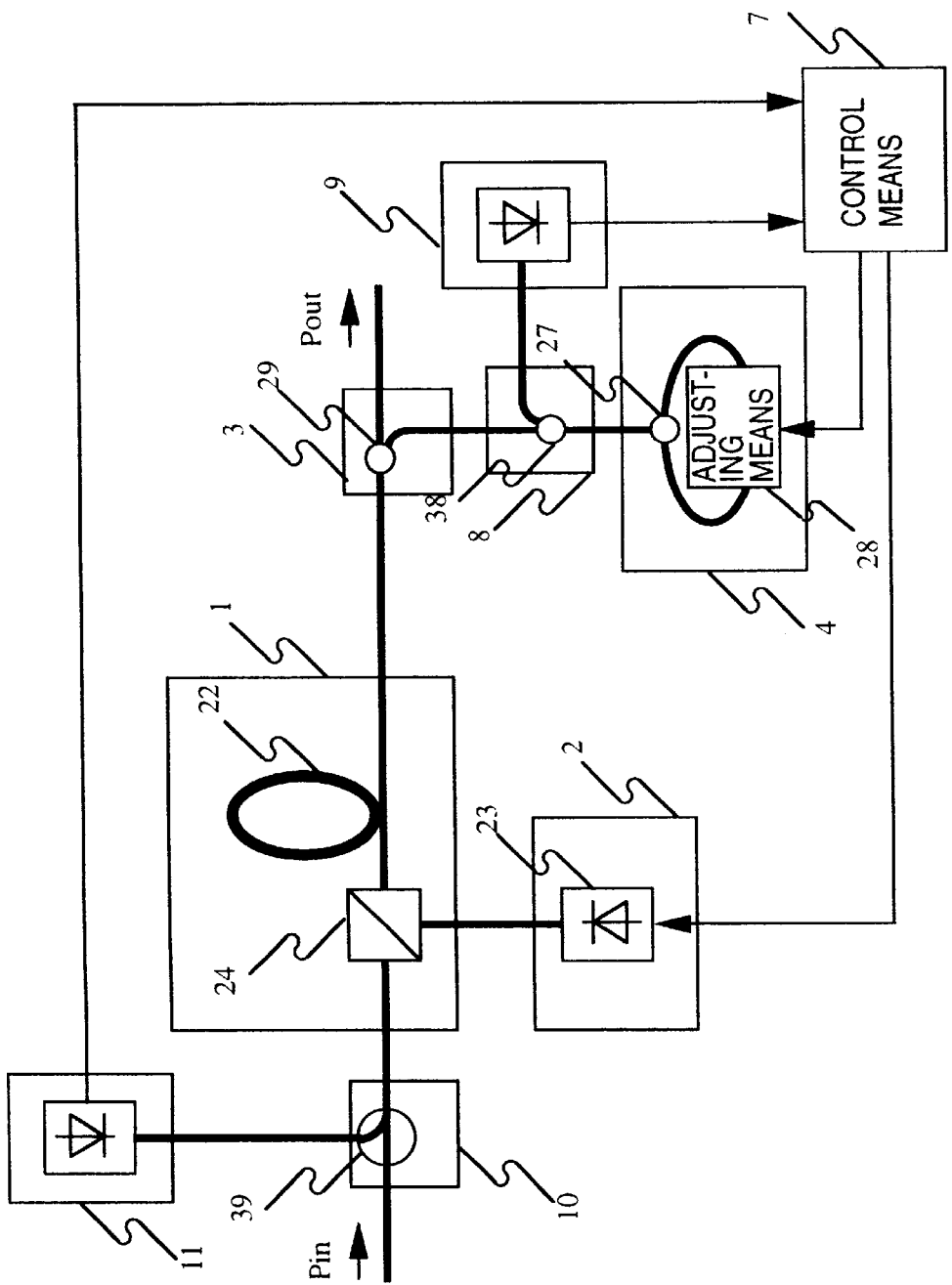
FIG. 10 is a diagram showing a specific configuration of an example of the light amplification apparatus depicted in FIG. 2.

FIG. 10 shows a specific configuration of an example of the light amplification apparatus depicted in FIG. 2. As shown in FIG. 10, a part of light power returned by the return means 4 is made to branch, for example, by a light coupler (1:99) 38 as the light branching means 8 so that light power just before returning to the light amplification medium 1 is detected by the light detection means 9. On the other hand, a part of the amplified return light from the light amplification medium 1 is made to branch by a circulator 39 which acts as the branching means 10 provided prior to the light amplification medium 1, so that the light power of the light branch is detected by the light detection means 11. As shown in FIG. 10, the return light is made to branch in the direction of the light detection means 11 by the circulator 39 correspondingly to the direction of the movement of the return light. The ratio of light power detected by the light detection means 9 to light power detected by the light detection means 11 exhibits a gain of the return light in the light amplification medium 1. This gain is also coincident with a gain of the signal light input Pin in the light amplification medium 1. Accordingly, in the case where the 980 nm excitation light source 23 and the adjusting means 28 are controlled on the basis of the detection light power ratio, the signal light input Pin can be gain-controlled so that a light surge is suppressed.

Figure 11:
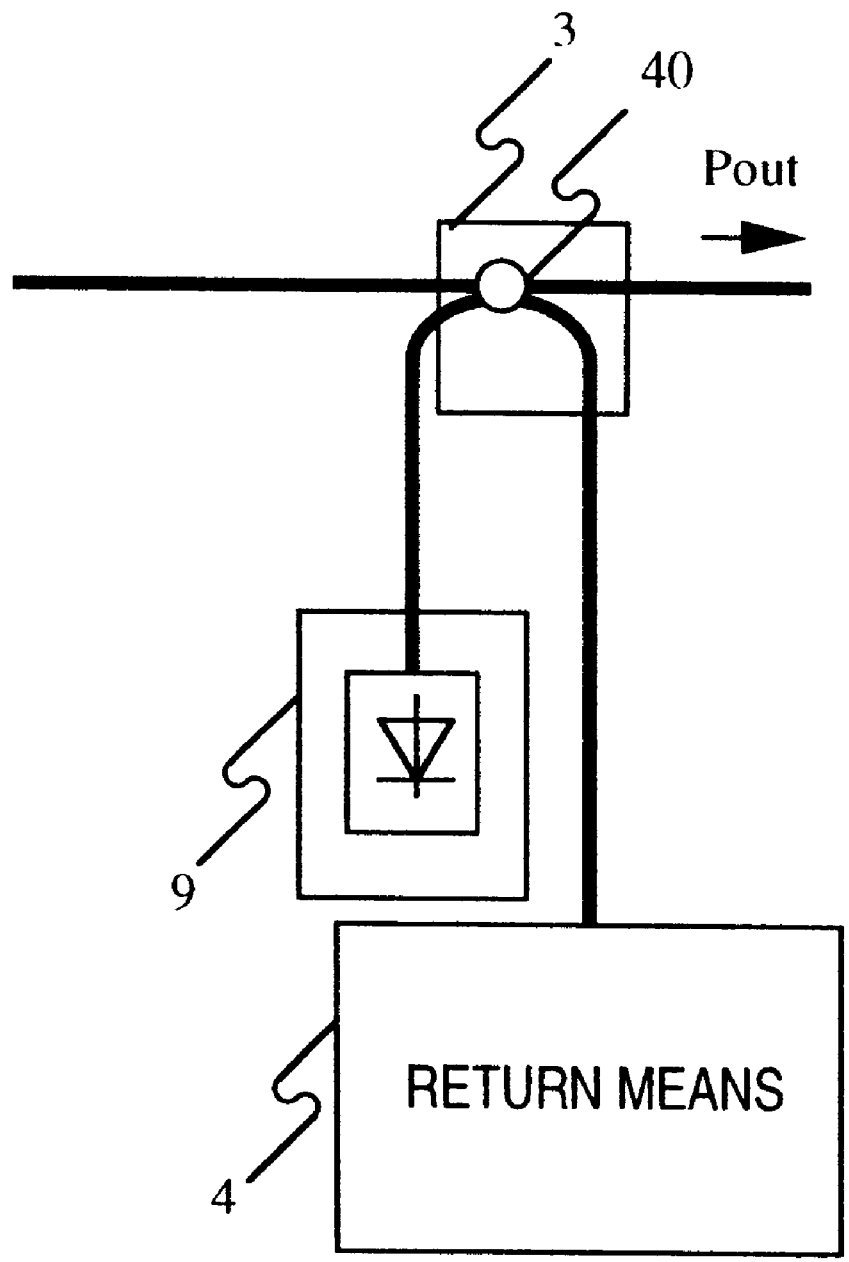
FIG. 11 is a diagram showing a modification of part configuration in the light amplification apparatus.

Incidentally, in the case where signal light is amplified by the light amplification medium, the amplified signal light contains light components of wavelengths other than the signal light. Because the light components can become a cause of error, it is preferable that the light components are removed. Accordingly, in the case where a light filter with a band width of about 3 nm is disposed between the return means 4 and the light branching means 8 or prior to the light detection means 9, the light components other than the signal light generated by the light amplification medium 1 or the adjusting means 28 can be removed by the light filter so that more accurate gain control can be performed. The light filter may be disposed between the light amplification medium 1 and the light branching means 10 or between the light branching means 10 and 11 in the same manner as described above. Further, in the case where a 2×2 light coupler 40 is used as the light branching means 3 as shown in FIG. 11, the light branching means 8 is not required so that the number of parts can be reduced.

Figure 12:
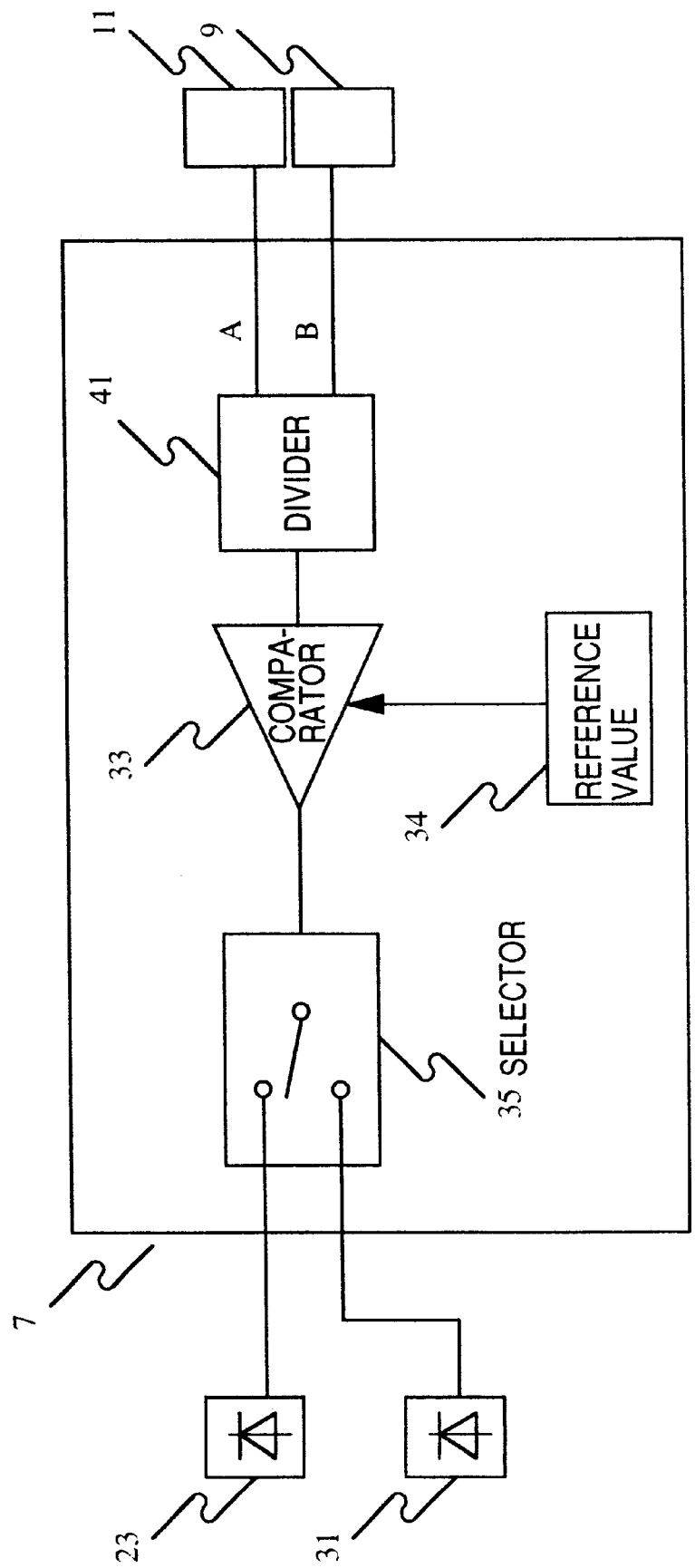
FIG. 12 is a diagram showing a specific configuration of the control means in the light amplification apparatus.
Figure 13:
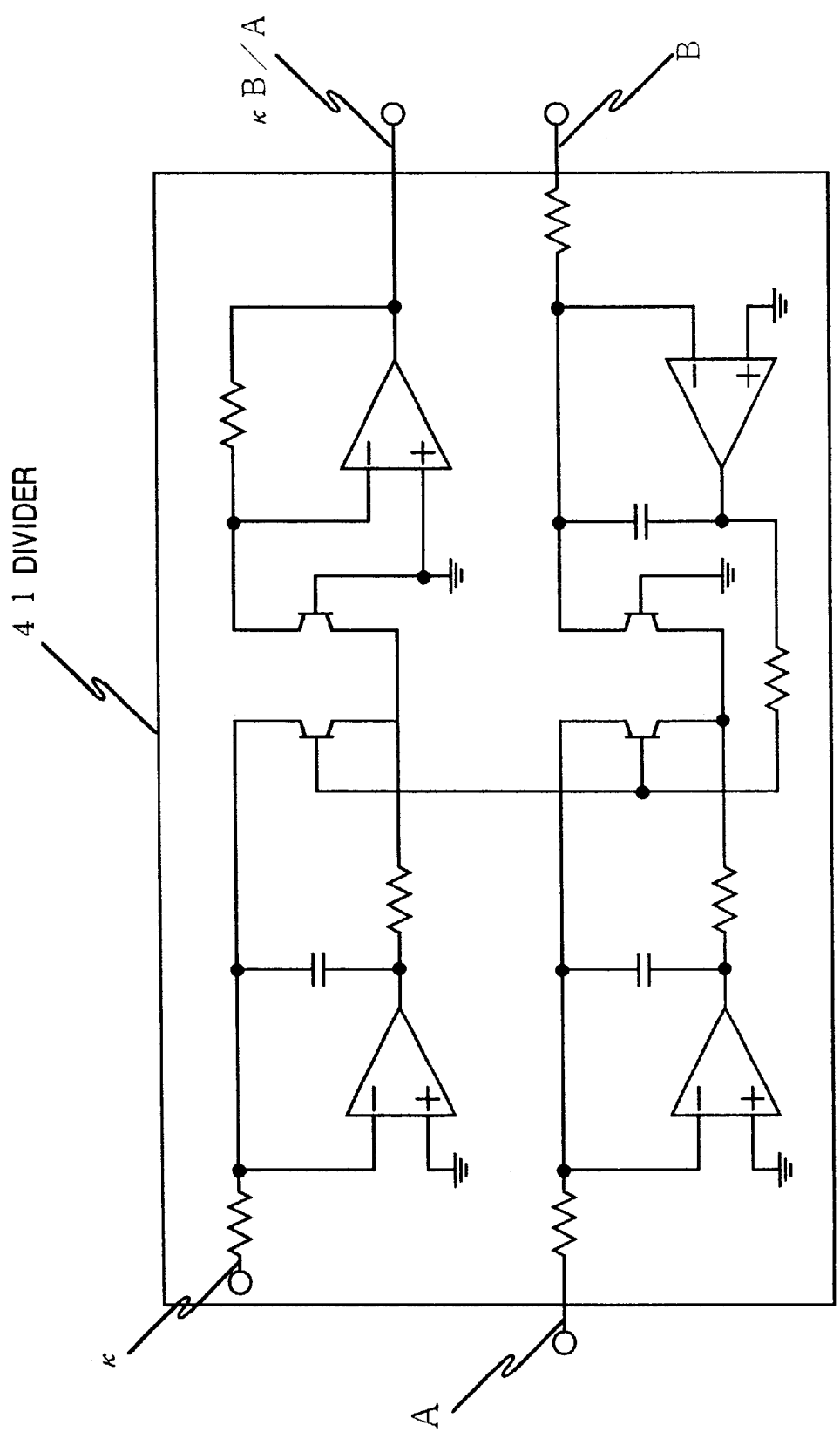
FIG. 13 is a diagram showing a specific configuration of the divider in the control means.
Figure 14A:
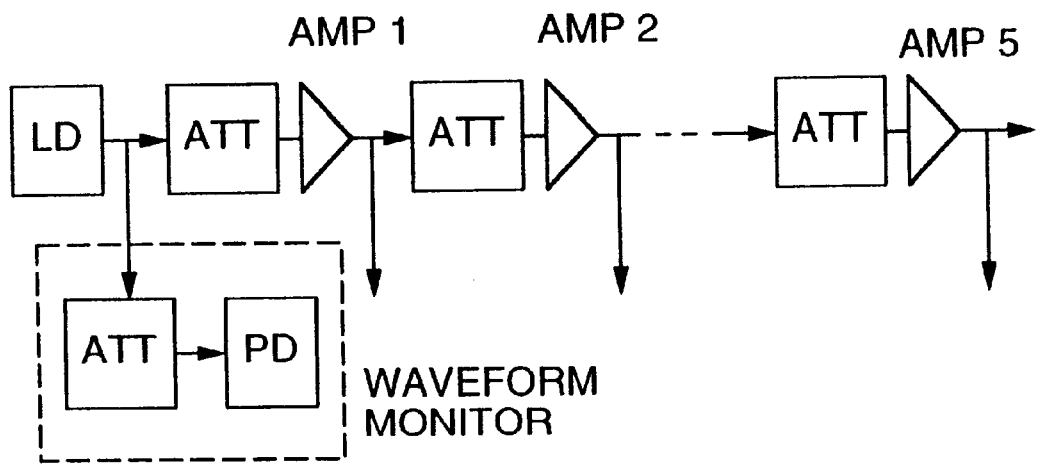
FIGS. 14A and 14B, are diagrams for explaining the change of the light output level corresponding to the signal light rising time in each of five conventional light amplification apparatuses in the case where the five conventional light amplification apparatuses are connected dependently.
Figure 14B:
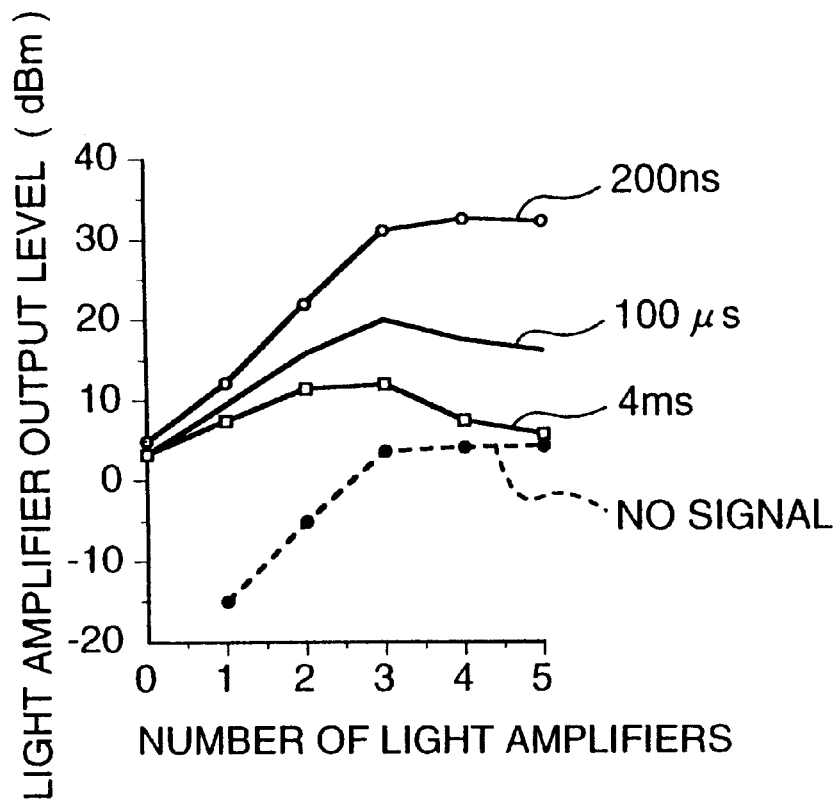

FIG. 12 shows a specific configuration of the control means 7 depicted in FIG. 10. As shown in FIG. 12, the value of κB/A is calculated as an equivalent gain by a divider 41 upon the assumption that the values of light power detected by light detection means 9 and 11 are B and A respectively and κ is a constant, and a deviation of the value of κB/A from a predetermined reference value 34 is detected as an error signal by a comparator 33. Thereafter, the same processing as in FIG. 6 is made. FIG. 13 shows a specific configuration of the divider 41. As shown in FIG. 13, the value of κB/A is calculated as an output of the divider 41 upon the assumption that κ is a constant set in the inside of the divider 41. By way of example, in the case of A=−25 dBm and B=0 dBm in κ=1, an equivalent gain of +25 dB is obtained.

Figure 22:
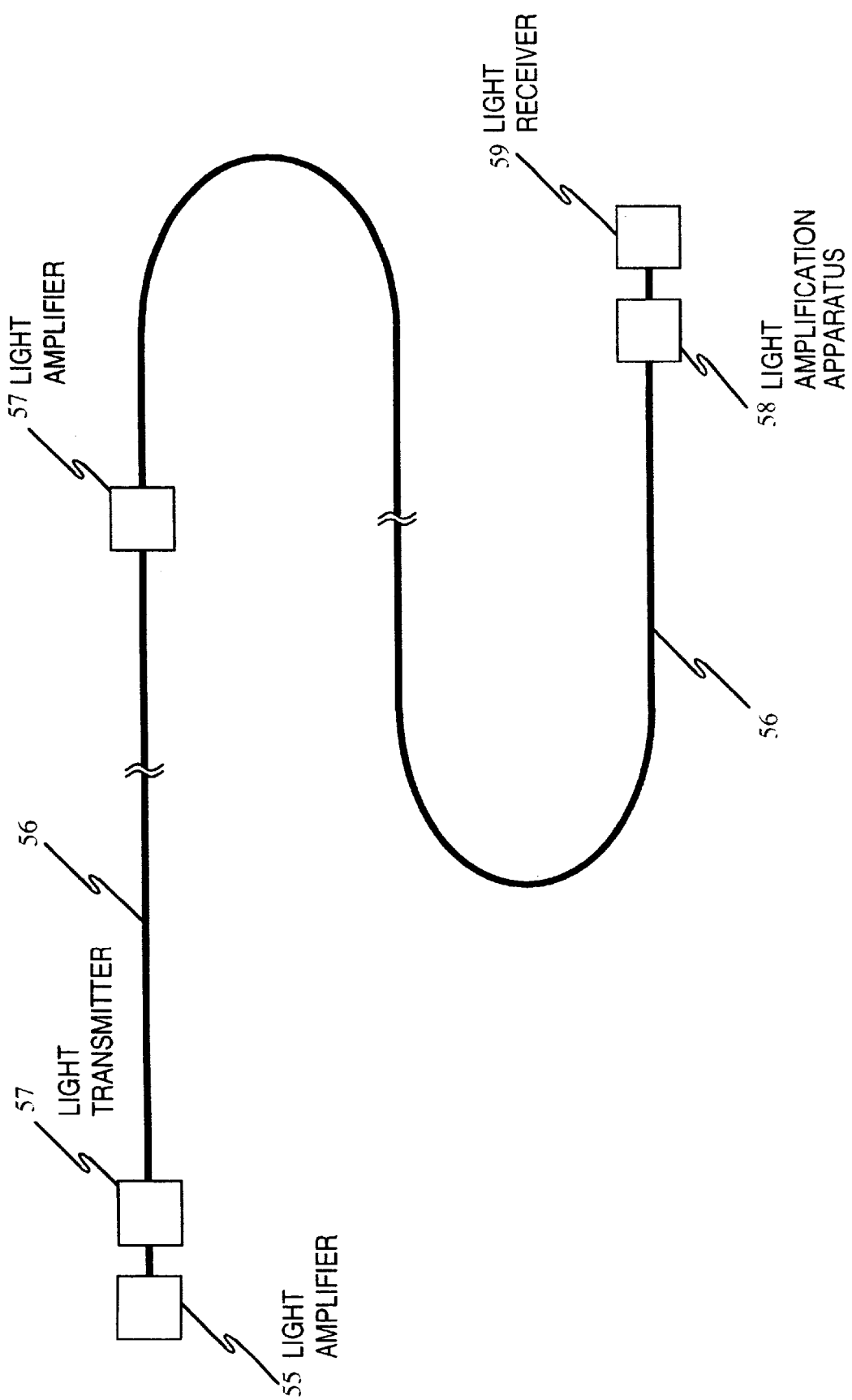
FIG. 22 is a diagram showing a specific configuration in the case where the light amplification apparatus according to the present invention is applied to a light transmission system.

FIG. 22 shows a specific configuration in the case where the light amplification apparatus according to the present invention is applied to a light transmission system. A light signal from a light transmitter 55 is transmitted to a light receiver by a transmission optical fiber 56 through at least one light amplifier 57, 58. As an example, there is shown the case where the light amplification apparatus 56 according to the present invention is applied only to the last-stage one of the three-stage light amplifiers.

The most fatal failure in the transmission system is a phenomenon that the light receiver 59 is broken by a light surge so that the light signal cannot be received any more. As described above, various causes of the occurrence of such a light surge can be thought of before the light signal is inputted to the light receiver. To suppress effectively the light surge generated bar the all causes, it is preferable that only the light amplifier prior to the light receiver 59 is provided as the light amplification apparatus 58 according to the present invention as shown in FIG. 22. According to the present invention, the influence of the light surge possibly generated in the whole system can be suppressed by only one light amplifier 58 so that safe-level light can be transmitted to the light receiver 59 with good control.

In some transmission system, transmission optical fibers 56 may be connected subordinately by an optical connector. In the case, as described above, there is the possibility that, for example, fine dust may burn because of the generated light surge correspondingly to the degree of stain at the connection end surface of the optical connector. If the end surface of the optical connector is melt by heat at the time of the burning of dust, a failure occurs in light signal transmission.

To remove such a risk, each of all the light amplifiers 57 and 58, as well as only one light amplifier 58 as shown in FIG. 22, may be replaced by the light amplification apparatus 58 according to the present invention so that it is possible to construct a transmission system which is high in safety and good in control performance.

Although the light amplification apparatus according to the present invention has been described above, various embodiments may be thought of. For example, the basic block diagrams of the light amplification apparatus according to the present invention are shown in FIGS. 1, 2, 16 and 19 respectively. Configurations of any combination of those block diagrams may be considered easily.

Industrial Applicability

As described above, according to the present invention, it is possible to provide a light amplification medium control method and a light amplification apparatus which is simple in configuration and in which a signal light input can be amplified while suppressing the occurrence of a light surge without deterioration of S/N of the light output and with good control response, and a system using the same.

In addition, the bad influence of the light surge in the position posterior to the light amplification apparatus can be removed, so that both reliability and safety upon the light transmission system can be improved.

What is claimed is:

1. A light amplification apparatus comprising a light amplification medium for providing an amplified light output upon excitation thereof, and an excitation source for exciting said light amplification medium so as to provide said amplified light output, said light amplification apparatus further comprising: a first branching means for making a part of the amplified light output of said light amplification medium branch; a return means for returning the resulting light branch obtained by said first branching means to said light amplification medium through said first branching means in a direction reverse to the direction of said amplified light output; a second branching means for making a part of said amplified light output passed through said first branching means branch; a third branching means for making a part of the resulting light branch obtained by said second branching means further branch; a first light detection means for detecting light through said third branching means; a second light detection means for detecting the resulting light branch obtained by said third branching means through a light filter; and a control means for controlling at least one of said excitation source and said return means on the basis of light power detected by said first light detection means and light power detected by said second light detection means.

2. A light amplification apparatus comprising, as main constituent elements, a light amplification medium for providing an amplified light output upon excitation thereof, and an excitation source for exciting said light amplification medium so as to provide said amplified light output, and further comprising a first branching means for making a part of said amplified light output of said light amplification medium branch, a return means for returning the resulting light branch obtained by said first branching means to said light amplification medium through said first branching means in a direction reverse to the direction of said amplified light output, a second branching means for making a part of said amplified light output passed through said first branching means branch, a light detection means for detecting the resulting light branch obtained by said second branching means, and a control means for controlling at least one of said excitation source and said return means on the basis of light power detected by said light detection means, wherein: said first branching means is constituted as a light coupler; and said return means is constituted by a light coupler for making the resulting light branch obtained by said first branching means branch into two directions, and an adjusting means for adjusting light power of the resulting two-directional light branches obtained by said light coupler and returning the adjusted two-directional light branches in reverse directions through said light coupler.

3. A light amplification apparatus comprising, as main constituent elements, a light amplification medium for providing an amplified light output upon excitation thereof, and an excitation source for exciting said light amplification medium so as to provide said amplified light output, and further comprising a first branching means for making a part of said amplified light output of said light amplification medium branch, a return means for returning the resulting light branch obtained by said first branching means to said light amplification medium through said first branching means in a direction reverse to the direction of said amplified light output, a second branching means for making a part of said amplified light output passed through said first branching means branch, a light detection means for detecting the resulting light branch obtained by said second branching means, a third branching means for making a part of said signal light input branch to said light amplification medium, a light detection means for detecting the resulting light branch obtained by said third branching means, and a control means for controlling at least one of said excitation source and said return means on the basis of light power detected by said light detection means, wherein: said first branching means is constituted as a light coupler; and said return means is constituted by a light coupler for making the resulting light branch obtained by said first branching means branch into two directions, and an adjusting means for adjusting light power of the resulting two-directional light branches obtained by said light coupler and returning the adjusted two-directional light branches in reverse directions through said light coupler.

4. A light amplification apparatus comprising, as main constituent elements, a light amplification medium for providing an amplified light output upon excitation thereof, and an excitation source for exciting said light amplification medium so as to provide said amplified light output, and further comprising a first branching means for making a part of said amplified light output of said light amplification medium branch, a return means for returning the resulting light branch obtained by said first branching means to said light amplification medium through said first branching means in a direction reverse to the direction of said amplified light output, a second branching means for making a part of said amplified light output passed through said first branching means branch, a third branching means for making a part of the resulting light branch obtained by said second branching means further branch, a first light detection means for detecting light through said third branching means, a second light detection means for detecting the resulting light branch obtained by said third branching means through a filter, and a control means for controlling at least one of said excitation source and said return means on the basis of detected light power, wherein: each of said first and second branching means is constituted as a light coupler; said light filter is constituted by a low-pass filter or a high-pass filter; and said return means is constituted by a light coupler for making the resulting light branch obtained by said first branching means branch into two directions, and an adjusting means for adjusting light power of the resulting two-directional light branches obtained by said light coupler and returning the adjusted two-directional light branches in reverse directions through said light coupler.

5. A light amplification apparatus comprising, as main constituent elements, a light amplification medium for providing an amplified light output upon excitation thereof, and an excitation source for exciting said light amplification medium so as to provide said amplified light output, and further comprising a first branching means for making a part of said amplified light output of said light amplification medium branch, a return means for returning the resulting light branch obtained by said first branching means to said light amplification medium through said first branching means in a direction reverse to the direction of said amplified light output, a second branching means for making a part of said light output passed through said first branching means branch, a light detection means for detecting the resulting light branch obtained by said second branching means, and a control means for controlling at least one of said excitation source and said return means on the basis of light power detected by said light detection means, wherein: said first branching means is constituted as a light coupler; and said return means is constituted by an adjusting means for adjusting light power of the resulting light branch obtained by said first branching means, and a reflection means for reflecting the light adjusted by said adjusting means in a reverse direction and returning the reflected light in a reverse direction through said adjusting means.

6. A light amplification apparatus comprising, as main constituent elements, a light amplification medium for providing an amplified light output upon excitation thereof, and an excitation source for exciting said light amplification medium so as to provide said amplified light output, and further comprising a first branching means for making a part of said amplified light output of said light amplification medium branch, a return means for returning the resulting light branch obtained by said first branching means to said light amplification medium through said first branching means in a direction reverse to the direction of said amplified light output, a second branching means for making a part of said amplified light output passed through said first branching means branch, a light detection means for detecting the resulting light branch obtained by said second branching means, a third branching means for making a part of said signal light input branch to said light amplification medium, a light detection means for detecting the resulting light branch obtained by said third branching means, and a control means for controlling at least one of said excitation source and said return means on the basis of light power from said light detection means, wherein: said first branching means is constituted as a light coupler; and said return means includes an adjusting means for adjusting light power of the resulting light branch obtained by said first branching means, and a reflection means for reflecting the light adjusted by said adjusting means in a reverse direction and returning the reflected light in a reverse direction through said adjusting means.

7. A light amplification apparatus comprising, as main constituent elements, a light amplification medium for providing an amplified light output upon excitation thereof, and an excitation source for exciting said light amplification medium so as to provide said amplified light output, and further comprising a first branching means for making a part of said amplified light output of said light amplification medium branch, a return means for returning the resulting light branch obtained by said first branching means to said light amplification medium through said first branching means in a direction reverse to the direction of said amplified light output, a second branching means for making a part of said amplified light output passed through said first branching means branch, a light detection means for detecting the resulting light branch obtained by said second branching means, and a control means for controlling at least one of said excitation source and said return means on the basis of light power detected by said light detection means, wherein said control means includes a comparator for detecting a deviation of light power detected by said first detection means from a predetermined reference value as an error signal, and a selector for selecting said error signal as a suppression control signal to said return means or as an excitation control signal to said excitation source, on the basis of the polarity of said error signal from said comparator.

8. A light amplification apparatus comprising, as main constituent elements, a light amplification medium for providing an amplified light output upon excitation thereof, and an excitation source for exciting said light amplification medium so as to provide said amplified light output, and further comprising a first branching means for making a part of said amplified light output of said light amplification medium branch, a return means for returning the resulting light branch obtained by said first branching means to said light amplification medium through said first branching means in a direction reverse to the direction of said amplified light output, a second branching means for making a part of said amplified light output through said first branching means branch, a light detection means for detecting the resulting light branch obtained by said second branching means, a third branching means for making a part of said signal light input branch to said light amplification medium, a light detection means for detecting the resulting light branch obtained by said third branching means, and a control means for controlling at least one of said excitation source and said return means on the. basis of light power detected by said light detection means, wherein said control means includes a comparator for detecting a deviation of light power detected by said first detection means from a predetermined reference value as an error signal and transmitting said error signal as an excitation control signal to said excitation source, a comparator for detecting a deviation of light power detected by said second detection means from a predetermined reference value as an error signal, and a selector for determining, on the basis of the polarity of said error signal from said comparator, whether a suppression control signal is to be transmitted to said return means or not.

9. A light amplification apparatus comprising, as main constituent elements, a light amplification medium for providing an amplified light output upon excitation thereof, and an excitation source for exciting said light amplification medium so as to provide said amplified light output, and further comprising a first branching means for making a part of said amplified light output of said light amplification medium branch, a return means for returning the resulting light branch obtained by said first branching means to said light amplification medium through said first branching means in a direction reverse to the direction of said amplified light output, a second branching means for making a part of said amplified light output passed through said first branching means branch, a third branching means for making a part of the resulting light branch obtained by said second branching means further branch, a light detection means for detecting light through said third branching means, a second light detection means for detection through said third branching means through a light filter, and a control means for controlling at least one of said excitation source and said return means on the basis of light power from said first light detection means and light power from said second light detection means, wherein said control means is constituted by a comparator for detecting a deviation of light power detected by said first detection means from a predetermined reference value as an error signal and transmitting said error signal as an excitation control signal to said excitation source, a comparator for detecting a deviation of light power detected by said second detection means from a predetermined reference value as an error signal, and a selector for determining, on the basis of the polarity of said error signal from said comparator, whether a suppression control signal is to be transmitted to said return means or not.

10. A light amplification apparatus comprising, as main constituent elements, a light amplification medium for providing an amplified light output upon excitation thereof, and an excitation source for exciting said light amplification medium so as to provide said amplified light output, and further comprising a first branching means for making a part of said amplified light output of said light amplification medium branch, a return means for returning the resulting light branch obtained by said first branching means to said light amplification medium through said first branching means in a direction reverse to the direction of said amplified light output, a second branching means for making a part of said return light from said return means to said first branching means branch, a first light detection means for detecting the resulting light branch obtained by said second branching means, a third branching means for making a part of the resulting return light returned to said light amplification medium and amplified by said light amplification medium branch, a second light detection means for detecting the resulting light branch obtained by said third branching means, and a control means for controlling at least one of said excitation source and said return means on the basis of light power detected by said first light detection means and light power detected by said second light detection means.

11. A light amplification apparatus comprising, as main constituent elements, a light amplification medium for providing an amplified light output upon excitation thereof, and an excitation source for exciting said light amplification medium so as to provide said amplified light output, and further comprising a first branching means for making a part of said amplified light output of said light amplification medium branch, a return means for returning the resulting light branch obtained by said first branching means to said light amplification medium through said first branching means in a direction reverse to the direction of said amplified light output, a second branching means for making a part of said return light from said return means to said first branching means branch, a first light detection means for detecting the resulting light branch obtained by said second branching means, a third branching means for making a part of the resulting return light returned to said light amplification medium and amplified by said light amplification medium branch, a second light detection means for detecting the resulting light branch obtained by said third branching means, and a control means for controlling at least one of said excitation source and said return means on the basis of light power detected by said first light detection means and light power detected by said second light detection means, wherein said control means is constituted by a divider for calculating a ratio of light power between light power detected by said first light detection means and light power detected by said second light detection means, a comparator for detecting a deviation of the ratio of light power obtained by said divider from a predetermined reference value as an error signal, and a selector for selecting said error signal as a suppression control signal to said return means or as an excitation control signal to said excitation source on the basis of the polarity of said error signal from said comparator.

12. A light amplification apparatus comprising:
 a light amplification medium for providing an amplified light output upon excitation thereof;
 an excitation source for exciting the light amplification medium so as to provide the amplified light output;

branching means for making a part of the amplified light output of the light amplification medium branch; and return means for returning the resulting light branch obtained by the branching means to the light amplification medium in a direction reverse to a direction of the amplified light output.

13. A method of controlling a light amplification medium in a light amplification apparatus, the light amplification apparatus including the light amplification medium and an excitation source for exciting the light amplification medium so as to provide an amplified light output, the method comprising the steps of:

making a part of the amplified light output of the light amplification medium branch; and returning the resulting light branch to the light amplification medium in a direction reverse to a direction of the amplified light output.

14. A method of controlling a light amplification medium in a light amplification apparatus, the light amplification apparatus including the light amplification medium and an excitation source for exciting the light amplification medium so as to provide an amplified light output, the method comprising the steps of:

making a part of the amplified light output of the light amplification medium branch; and returning at least the resulting light branch to the light amplification medium in a direction reverse to a direction of the amplified light output at least based on a prediction of a light surge.

15. A method of controlling a light amplification medium in a light amplification apparatus, the light amplification apparatus including the light amplification medium and an excitation source for exciting the light amplification medium so as to provide an amplified light output, the method comprising the steps of:

making a part of the amplified light output of the light amplification medium branch;

amplifying the resulting light branch based on a prediction of a light surge; and returning the amplified light branch to the light amplification medium in a direction reverse to a direction of the amplified light output.

16. A method of controlling a light amplification medium in a light amplification apparatus, the light amplification apparatus including the light amplification medium and an excitation source for exciting the light amplification medium, the method comprising the step of:

making light with a bandwidth of at least 10 nm in a light amplification band of the light amplification medium act on the light amplification medium to suppress a light surge.

17. A method of controlling a light amplification medium according to claim 16, wherein the light made to act on the light amplification medium has a bandwidth in a range of 1500 nm to 1600 nm.

18. A method of controlling a light amplification medium in a light amplification apparatus, the light amplification apparatus including the light amplification medium and an excitation source for exciting the light amplification medium, the method comprising the step of:

making light having a plurality of wavelengths act on the light amplification medium to suppress a light surge.

19. A method of controlling a light amplification medium in a light amplification apparatus, the light amplification apparatus including the light amplification medium and an excitation source for exciting the light amplification medium, the method comprising the steps of:

detecting energy accumulated in the light amplification medium; and positively controlling the light amplification medium to suppress the energy accumulated in the light amplification medium.

20. A method of controlling a light amplification medium in a light amplification apparatus, the light amplification apparatus including the light amplification medium and an excitation source for exciting the light amplification medium, the method comprising the steps of:

detecting a light input introduced into the light amplification medium; and positively controlling the light amplification medium to suppress energy accumulated in the light amplification medium.

21. A light amplification apparatus comprising:

a light amplification medium for providing an amplified light output upon excitation thereof;

an excitation source for exciting the light amplification medium so as to provide the amplified light output;

first branching means for making a part of the amplified light output of the light amplification medium branch;

return means for returning the resulting light branch obtained by the first branching means to the light amplification medium through the first branching means in a direction reverse to a direction of the light output;

second branching means for making a part of the amplified light output which has passed through the first branching means branch;

first light detection means for detecting the resulting light branch obtained by the second branching means;

third branching means for making a part of a light input introduced into the light amplification medium branch;

second light detection means for detecting the resulting light branch obtained by the third branching means; and control means for controlling at least one of the excitation source and the return means based on a light power detected by the first light detection means and a light power detected by the second light detection means.

22. A light amplification apparatus comprising:

a light amplification medium for providing an amplified light output upon excitation thereof;

an excitation source for exciting the light amplification medium so as to provide the amplified light output;

branching means for making a part of the amplified light output of the light amplification medium branch; and return means for returning at least the resulting light branch obtained by the branching means to the light amplification medium in a direction reverse to a direction of the amplified light output based on a prediction of a light surge.

23. A light amplification apparatus according to claim 22, wherein the prediction of the light surge is performed by detecting a light input introduced into the light amplification medium.

24. A light amplification apparatus according to claim 22, wherein the prediction of the light surge is performed by detecting energy accumulated in the light amplification medium.

25. A light amplification apparatus comprising:

a light amplification medium for providing an amplified light output upon excitation thereof;

an excitation source for exciting the light amplification medium so as to provide the amplified light output;

branching means for making a part of the amplified light output of the light amplification medium branch; and return means for amplifying the resulting light branch obtained by the branching means based on a prediction of a light surge, and returning the amplified light branch to the light amplification medium in a direction reverse to a direction of the amplified light output.

26. A light amplification apparatus comprising:

a light amplification medium for providing an amplified light output upon excitation thereof;

an excitation source for exciting the light amplification medium so as to provide the amplified light output;

first branching means for making the amplified part of a light output of the light amplification medium branch;

return means for returning the resulting light branch obtained by the first branching means to the light amplification medium in a direction reverse to a direction of the amplified light output;

second branching means for making a part of the amplified light output of the light amplification medium branch;

light detection means for detecting the resulting light branch obtained by the second branching means; and control means for controlling at least one of the excitation source and the return means based on a light power detected by the light detection means.

27. A light amplification apparatus comprising:

a light amplification medium for providing an amplified light output upon excitation thereof;

an excitation source for exciting the light amplification medium so as to provide the amplified light output;

first branching means for making the amplified part of a light output of the light amplification medium branch;

return means for returning the resulting light branch obtained by the first branching means to the light amplification medium through the first branching means in a direction reverse to a direction of the amplified light output;

second branching means for making a part of the amplified light output which has passed through the first branching means branch;

light detection means for detecting the resulting light branch obtained by the second branching means; and control means for controlling at least one of the excitation source and the return means based on a light power detected by the light detection means.

28. A light transmission system comprising:

a light transmitter for transmitting a signal light;

a transmission optical fiber for transmitting the signal light transmitted from said transmitter;

light amplifiers; and a light receiver for receiving said signal light from said transmission optical fiber;

wherein at least one of said light amplifiers is a light amplification apparatus according to claim 12.

* * * * *